(12) United States Patent
Kawana et al.

(10) Patent No.: US 10,748,865 B2
(45) Date of Patent: Aug. 18, 2020

(54) COPPER PASTE FOR JOINING, METHOD FOR MANUFACTURING JOINED BODY, AND METHOD FOR MANUFACTURING SEMICONDUCTOR DEVICE

(71) Applicant: HITACHI CHEMICAL COMPANY, LTD., Tokyo (JP)

(72) Inventors: Yuki Kawana, Tokyo (JP); Hideo Nakako, Tokyo (JP); Dai Ishikawa, Tokyo (JP); Chie Sugama, Tokyo (JP); Kazuhiko Kurafuchi, Tokyo (JP); Yoshinori Ejiri, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 96 days.

(21) Appl. No.: 16/096,807

(22) PCT Filed: Apr. 20, 2017

(86) PCT No.: PCT/JP2017/015912
§ 371 (c)(1),
(2) Date: Oct. 26, 2018

(87) PCT Pub. No.: WO2017/188123
PCT Pub. Date: Nov. 2, 2017

(65) Prior Publication Data
US 2020/0176411 A1    Jun. 4, 2020

(30) Foreign Application Priority Data

Apr. 28, 2016  (JP) .................................. 2016-090981

(51) Int. Cl.
*H01L 23/48*         (2006.01)
*H01L 23/52*         (2006.01)
(Continued)

(52) U.S. Cl.
CPC ............ *H01L 24/29* (2013.01); *B22F 1/0014* (2013.01); *B22F 1/0059* (2013.01); *B22F 7/064* (2013.01);
(Continued)

(58) Field of Classification Search
CPC . H01L 2224/13147; H01L 2224/05147; H01L 2224/45147; H01L 2224/29147;
(Continued)

(56) References Cited

U.S. PATENT DOCUMENTS 5,612,121 A    3/1997  Tani et al.
5,876,841 A    3/1999  Banba et al.
(Continued)

FOREIGN PATENT DOCUMENTS

CN       104797360 A    7/2015
JP         4928639 B2    5/2012
(Continued)

OTHER PUBLICATIONS

R. Khazaka, L. Mendizabal, and D. Henry, "Review on Joint Shear Strength of Nano-Silver Paste and its Long-Term High Temperature Reliability", Journal of Electronic Materials, vol. 43, No. 7, 2014, p. 2459-2466.

*Primary Examiner* — Theresa T Doan
(74) *Attorney, Agent, or Firm* — Fitch, Even, Tabin & Flannery, LLP

(57) ABSTRACT

Provided is a copper paste for joining including copper particles, second particles including a metal element other than copper, and a dispersion medium, in which the copper particles include submicro copper particles having a volume-average particle diameter of 0.12 μm or more and 0.8 μm or less and micro copper particles having a volume-average particle diameter of 2 μm or more and 50 μm or less, a sum of a content of the submicro copper particles and a (Continued)

content of the micro copper particles is 80% by mass or more of a sum of masses of the copper particles and the second particles, the content of the submicro copper particles is 30% by mass or more and 90% by mass or less of a sum of a mass of the submicro copper particles and a mass of the micro copper particles, and a content of the second particles is 0.01% by mass or more and 10% by mass or less of the sum of the masses of the copper particles and the second particles.

17 Claims, 4 Drawing Sheets

(51) Int. Cl.
- *H01L 29/40* (2006.01)
- *H01L 23/00* (2006.01)
- *B32B 9/04* (2006.01)
- *B22F 1/00* (2006.01)
- *B22F 7/06* (2006.01)
- *B22F 7/08* (2006.01)

(52) U.S. Cl.
CPC ............... *B22F 7/08* (2013.01); *B32B 9/041* (2013.01); *H01L 24/83* (2013.01); *B22F 2301/10* (2013.01); *B22F 2304/10* (2013.01); *B32B 2457/14* (2013.01); *H01L 2224/2912* (2013.01); *H01L 2224/29109* (2013.01); *H01L 2224/29111* (2013.01); *H01L 2224/29118* (2013.01); *H01L 2224/29124* (2013.01); *H01L 2224/29139* (2013.01); *H01L 2224/29144* (2013.01); *H01L 2224/29147* (2013.01); *H01L 2224/29155* (2013.01); *H01L 2224/29164* (2013.01); *H01L 2224/29169* (2013.01); *H01L 2224/29172* (2013.01); *H01L 2224/8384* (2013.01); *H01L 2924/0103* (2013.01); *H01L 2924/0105* (2013.01); *H01L 2924/01013* (2013.01); *H01L 2924/01023* (2013.01); *H01L 2924/01028* (2013.01); *H01L 2924/01029* (2013.01); *H01L 2924/01046* (2013.01); *H01L 2924/01047* (2013.01); *H01L 2924/01049* (2013.01); *H01L 2924/01051* (2013.01); *H01L 2924/01078* (2013.01); *H01L 2924/01079* (2013.01); *H01L 2924/35121* (2013.01)

(58) Field of Classification Search
CPC . H01L 2224/29647; H01L 2224/48847; H01L 2224/83447; H01L 2224/8384; H01L 24/25; H01L 2224/29347; H01L 24/26; H01L 24/90; H01L 24/27; H01L 24/29; B22F 1/0014; B22F 1/0059; B22F 1/0064
USPC .......................................... 257/782
See application file for complete search history.

(56) References Cited

U.S. PATENT DOCUMENTS

| | | | |
|---|---|---|---|
| 2006/0163744 A1* | 7/2006 | Vanheusden | H01L 23/5328 257/773 |
| 2013/0256894 A1* | 10/2013 | Adema | H01L 24/83 257/762 |

FOREIGN PATENT DOCUMENTS

| | | |
|---|---|---|
| JP | 5006081 B2 | 8/2012 |
| JP | 2014-167145 | 9/2014 |
| JP | 2014-199852 A | 10/2014 |
| JP | 2015-109434 A | 6/2015 |
| KR | 20150064054 A | 6/2015 |

* cited by examiner

COPPER PASTE FOR JOINING, METHOD FOR MANUFACTURING JOINED BODY, AND METHOD FOR MANUFACTURING SEMICONDUCTOR DEVICE

CROSS-REFERENCE TO RELATED APPLICATIONS

This application is a U.S. national phase application filed under 35 U.S.C. § 371 of International Application No. PCT/JP2017/015912, filed Apr. 20, 2017, designating the United States, which claims priority from Japanese Patent Application No. 2016-090981, filed Apr. 28, 2016, which are hereby incorporated herein by reference in their entirety.

TECHNICAL FIELD

The present invention relates to a copper paste for joining, a method for manufacturing a joined body and a method for manufacturing a semiconductor device in which the copper paste for joining is used, a joined body, and a semiconductor device.

BACKGROUND ART

In the manufacturing of semiconductor devices, a variety of joining materials are used in order to join a semiconductor element and a lead frame or the like (supporting member). High-melting-point lead solders have been used as a joining material for the joining of, among semiconductor devices, power semiconductors, LSI, and the like that are operated at a high temperature of 150° C. or higher. In recent years, an increase in the capacity of semiconductor elements and the energy-saving trend have increased the operation temperature to near the melting point of high-melting-point lead solders, which has made it difficult to ensure connection reliability. On the other hand, in association with the tightening of RoHS regulations, there has been a demand for joining materials containing no lead.

Hitherto, the joining of semiconductor elements using a material other than lead solders has been studied. For example, Patent Literature 1 proposes a technique for forming a sintered silver layer by sintering silver nanoparticles. Sintered silver as described above is known to have high connection reliability with respect to power cycles (Non Patent Literature 1).

Regarding a different material, a technique for forming a sintered copper layer by sintering copper particles is also proposed. For example, Patent Literature 2 discloses a copper paste for joining including copper (II) oxide particles and a reducing agent as a joining material for joining a semiconductor element and an electrode. In addition, Patent Literature 3 discloses a joining material including copper nanoparticles and copper micro particles and/or copper submicro particles.

CITATION LIST

Patent Literature

[Patent Literature 1] Japanese Patent No. 4928639
[Patent Literature 2] Japanese Patent No. 5006081
[Patent Literature 3] Japanese Unexamined Patent Publication No. 2014-167145

Non Patent Literature

[Non-Patent Literature 1] R. Khazaka, L. Mendizabal, D. Henry: J. ElecTron. Mater, 43(7), 2014, 2459 to 2466

SUMMARY OF INVENTION

Technical Problem

In the method described in Patent Literature 1, the densification of the sintered silver layer is essential in order to obtain high connection reliability, and thus a thermocompression process accompanying pressurization becomes necessary. In the case of carrying out a thermocompression process accompanying pressurization, there are problems of a decrease in the production efficiency, a decrease in the yield, and the like. Furthermore, in the case of using silver nanoparticles, a significant increase in the material costs due to silver and the like creates a problem.

In the method described in Patent Document 2, volume shrinkage during the reduction of copper oxide to copper is avoided by the thermocompression process. However, the thermocompression process has the above-described problems.

In the method described in Patent Literature 3, sintering is carried out without pressurization, but the method cannot be put into practical use due to the following fact. That is, the surfaces of the copper nanoparticles need to be modified with a protective agent in order to suppress oxidation and improve dispersibility, but the copper nanoparticles have a large specific surface area, and thus there is a tendency that the amount of a surface protective agent blended into a joining material including copper nanoparticles as a main component increases. In addition, there is a tendency that the amount of a dispersion medium blended increases in order to ensure dispersibility. Therefore, in the joining material described in Patent Literature 3, the proportion of the surface protective agent or the dispersion medium blended for the supply stability of storage, coating, or the like increases. In joining materials as described above, there is a tendency that volume shrinkage during sintering is likely to increase and the density after sintering is likely to decrease, which makes it difficult to ensure the strength of sintered bodies.

In addition, according to the present inventors' studies, it has been clarified that, in the above-described joining materials of the related art, the joining strength with respect to noble metal such as gold and silver is significantly poorer compared with the joining strength with respect to copper, nickel, and the like. For semiconductor elements, there are cases in which a treatment of coating a surface to be attached with noble metal such as gold or silver using a method such as plating or sputtering is carried out from the viewpoint of anti-rusting and the like. Treatments as described above facilitate performance tests before the mounting of semiconductor elements and are capable of suppressing the fluctuation of joining strength caused by the formation of an oxide coating. Joining materials also capable of strongly joining noble metal are capable of further improving connection reliability in the case of joining semiconductor elements as described above.

An object of the present invention is to provide a copper paste for joining capable of obtaining a sufficient joining strength even in a case in which a semiconductor element having a surface to be attached including noble metal is joined without pressurization. Another object of the present invention is to provide a method for manufacturing a joined body and a method for manufacturing a semiconductor device in which the copper paste for joining is used, a joined body, and a semiconductor device.

Solution to Problem

The present invention is a copper paste for joining including copper particles, second particles including a metal element other than copper, and a dispersion medium, in which the copper particles include submicro copper particles having a volume-average particle diameter of 0.12 µm or more and 0.8 µm or less and micro copper particles having a volume-average particle diameter of 2 µm or more and 50 µm or less, a sum of a content of the submicro copper particles and a content of the micro copper particles is 80% by mass or more of a sum of masses of the copper particles and the second particles, the content of the submicro copper particles is 30% by mass or more and 90% by mass or less of a sum of a mass of the submicro copper particles and a mass of the micro copper particles, and a content of the second particles is 0.01% by mass or more and 10% by mass or less of the sum of the masses of the copper particles and the second particles.

According to the copper paste for joining of the present invention, it is possible to obtain a sufficient joining strength even in a case in which a semiconductor element having a surface to be attached including noble metal is joined without pressurization. The present inventors assumed a reason for obtaining the above-described effect as described below. It is considered that, first, the submicro copper particles and the micro copper particles are included in specific proportions, and thus it is possible to sufficiently suppress volume shrinkage during sintering which is attributed to a surface protective agent or a dispersion medium while maintaining a sufficient sinterability, and it becomes possible to ensure the strength of sintered bodies and improve the joining force with the surface to be attached, and, furthermore, the second particles including metal other than copper serve as a sintering aid, and a sintered body in which a plurality of kinds of metal forms a solid solution or is dispersed is obtained, and thus the mechanical characteristics such as yield stress and fatigue strength of the sintered body are improved, and a sufficient joining strength with respect to the surface to be attached including noble metal is obtained.

The copper paste for joining of the present invention is capable of obtaining the above-described effects due to the submicro copper particles and the micro copper particles and thus has an advantage that the copper paste for joining can be more stably supplied at a lower cost compared with joining materials including expensive copper nanoparticles as a main component. Therefore, it becomes possible to further enhance production stability in the case of manufacturing joined bodies such as semiconductor devices.

Meanwhile, in the joining of a semiconductor element, the semiconductor element is desirably sintered at a low temperature from the viewpoint of reducing residual thermal stress caused by a difference in thermal expansion coefficient, but a decrease in the sintering temperature makes it difficult to ensure the joining strength. In contrast, according to the paste for joining of the present invention, a sufficient joining strength can be obtained even in a case in which a semiconductor element having a surface to be attached including noble metal is joined without pressurization while decreasing the sintering temperature to be lower than in the related art.

In the copper paste for joining, the second particles may be metal particles. The metal particles may include at least one kind of metal selected from the group consisting of zinc, silver, gold, platinum, tin, indium, vanadium, aluminum, nickel, antimony, and palladium, may include at least one kind of metal selected from the group consisting of zinc, silver, tin, indium, and vanadium, or may be zinc particles.

When the metal particles are added to the copper paste for joining, it is possible to further improve the joining strength with respect to the surface to be attached including noble metal.

An aspect ratio of the zinc particle may be 4 or more. The zinc particles having the above-described aspect ratio is capable of satisfying both the ease of the zinc particles being melted into the copper particles during sintering and the oxidation resistance.

The copper paste for joining of the present invention may include two or more kinds of the metal particles.

In the copper paste for joining of the present invention, the second particles may be fatty acid metal salt particles. The fatty acid metal salt particles may include an fatty acid metal salt of an fatty acid acid having 8 to 18 carbon atoms and silver, nickel, or zinc. The fatty acid metal salt particles may include at least one kind of fatty acid metal salt selected from the group consisting of zinc stearate, silver stearate, zinc laurate, nickel laurate, and zinc octylate.

When the fatty acid metal salt particles are added to the copper paste for joining, it is possible to further improve the joining strength with respect to the surface to be attached including noble metal.

A volume-average particle diameter of the second particles may be 150 µm or less. The second particles having the above-described volume-average particle diameter is capable of obtaining a sufficient contact area with respect to the surface to be attached including noble metal and is not easily oxidized.

The copper paste for joining of the present invention may be for non-pressurization joining In the present specification, "non-pressurization" refers to a state in which a member to be joined receives the weight thereof or the weight thereof plus a pressure of 0.01 MPa or less.

The present invention also provides a method for manufacturing a semiconductor device in which at least one of a first member and a second member is a semiconductor element, the method including a step of preparing a laminate in which a first member, the copper paste for joining, and a second member are laminated in this order in a direction in which a weight of the first member applies and sintering the copper paste for joining in a state in which the copper paste for joining receives the weight of the first member or the weight of the first member and a pressure of 0.01 MPa or less, in which at least one of the first member and the second member is a semiconductor element.

According to the method for manufacturing a semiconductor device of the present invention, the copper paste for joining is used, and thus it is possible to manufacture a semiconductor device having an excellent die shear strength even in a case in which a semiconductor element having a surface to be attached including noble metal is joined without pressurization. In addition, a semiconductor device manufactured using the method for manufacturing a semiconductor device of the present invention can become excellent in terms of the connection reliability.

A sintering temperature in the sintering step may be 300° C. or lower.

The present invention provides a joined body including a first member, a second member, and a sintered body of the copper paste for joining which joins the first member and the second member. The joined body of the present invention is joined through the sintered body in which the first member and the second member have a sufficient joining force. In addition, the joined body of the present invention includes a copper sintered body having an excellent thermal conductivity and thus can become excellent in terms of the heat dissipation property of a member.

In the joined body, at least one of the first member and the second member may include at least one kind of metal selected from the group consisting of silver, gold, platinum, and palladium on a surface in contact with the sintered body.

The present invention also provides a semiconductor device including a first member, a second member, and a sintered body of the copper paste for joining which joins the first member and the second member, in which at least one of the first member and the second member is a semiconductor element. The semiconductor device of the present invention has a sufficient joining force and includes a copper sintered body having a high thermal conductivity and a high melting point, and thus the semiconductor device has a sufficient die shear strength, is excellent in terms of the connection reliability, and can also become excellent in power cycle resistance.

Advantageous Effects of Invention

The present invention is capable of providing a copper paste for joining capable of obtaining a sufficient joining strength even in a case in which a semiconductor element having a surface to be attached including noble metal is joined without pressurization. Furthermore, the present invention is capable of providing a method for manufacturing a joined body and a method for manufacturing a semiconductor device in which the copper paste for joining is used, a joined body, and a semiconductor device.

DESCRIPTION OF EMBODIMENTS

Figure 1:
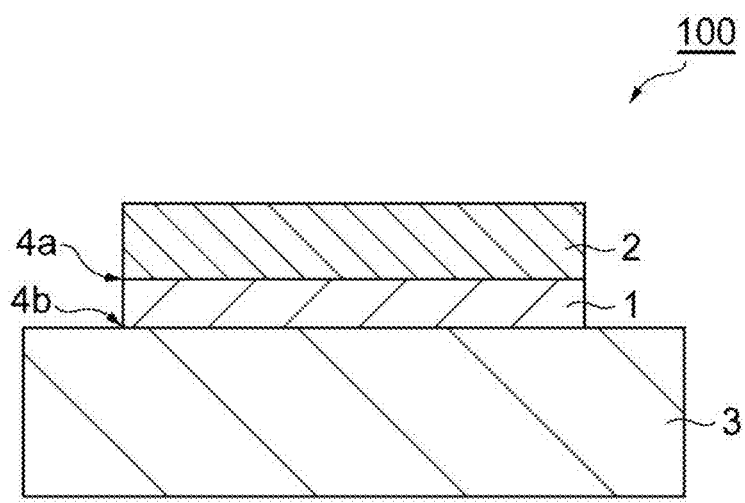
FIG. 1 is a schematic cross-sectional view illustrating an example of a joined body manufactured using a copper paste for joining of the present embodiment.

Hereinafter, an embodiment for carrying out the present invention (hereinafter, referred to as "the present embodiment") will be described in detail. The present invention is not limited to the following embodiment.

<Copper Paste for Joining>

A copper paste for joining of the present embodiment includes copper particles, second particles including a metal element other than copper, and a dispersion medium.

(Copper Particles)

As the copper particles according to the present embodiment, submicro copper particles and micro copper particles are exemplified.

Meanwhile, in the present specification, a submicro particle refers to a particle having a particle diameter of 0.1 μm or more and 1.0 μm or less, and a micro particle refers to a particle of more than 1.0 μm and 50 μm or less.

(Submicro Copper Particles)

The submicro copper particles need to be copper particles having sinterability in a temperature range of 250° C. or higher and 350° C. or lower. As the submicro copper particles, submicro copper particles including copper particles having a particle diameter of 0.12 μm or more and 0.8 μm or less are exemplified, and, for example, copper particles having a volume-average particle diameter of 0.12 μm or more and 0.8 μm or less can be used. When the volume-average particle diameter of the submicro copper particles is 0.12 μm or more, it becomes easy to obtain effects of the suppression of the synthesis cost of the submicro copper particles, favorable dispersibility, and the suppression of the amount of a surface treatment agent used. When the volume-average particle diameter of the submicro copper particles is 0.8 μm or less, it becomes easy to obtain an effect of the submicro copper particles being excellent in terms of the sinterability. From the viewpoint of further exhibiting the above-described effects, the volume-average particle diameter of the submicro copper particles may be 0.15 μm or more and 0.8 μm or less, may be 0.15 μm or more and 0.6 μm or less, may be 0.2 μm or more and 0.5 μm or less, or may be 0.3 μm or more and 0.45 μm or less.

Meanwhile, the volume-average particle diameter in the present specification refers to a 50% volume-average particle diameter. In the case of obtaining the volume-average particle diameter of the copper particles, the volume-average particle diameter can be obtained using a method in which a substance obtained by dispersing the copper particles which serve as a raw material or dried copper particles obtained by removing a volatile component from the copper paste for joining in a dispersion medium using a dispersant is measured using a light scattering-method particle size analyzer (for example, Shimadzu nano particle size analyzer (SALD-7500nano, manufactured by Shimadzu Corporation)). In the case of using the light scattering-method particle size analyser, hexane, toluene, α-terpineol, and the like can be used as the dispersion medium.

The content of the submicro copper particles may be 20% by mass or more and 90% by mass or less, may be 30% by mass or more and 90% by mass or less, may be 35% by mass or more and 85% by mass or less, or may be 40% by mass or more and 80% by mass or less of the sum of the masses of the copper particles and the second particles. When the content of the submicro copper particles is in the above-described range, it becomes easy to ensure the joining strength of a joined body that is manufactured by sintering the copper paste for joining, and, in a case in which the copper paste for joining is used to join a semiconductor element, there is a tendency that a semiconductor device exhibits a favorable die shear strength and a favorable connection reliability.

The content of the submicro copper particles is preferably 30% by mass or more and 90% by mass or less of the sum of the mass of the submicro copper particles and the mass of the micro copper particles. When the content of the submicro copper particles is 30% by mass or more, it is possible to sufficiently fill spaces among the micro copper particles with the submicro copper particles, it becomes easy to ensure the joining strength of a joined body that is manufactured by sintering the copper paste for joining, and, in a case in which the copper paste for joining is used to join a semiconductor element, there is a tendency that a semiconductor device exhibits a favorable die shear strength and a favorable connection reliability. When the content of the submicro copper particles is 90% by mass or less, it is possible to sufficiently suppress volume shrinkage when the copper paste for joining has been sintered, it becomes easy to ensure the joining strength of a joined body that is manufactured by sintering the copper paste for joining, and, in a case in which the copper paste for joining is used to join a semiconductor element, there is a tendency that a semiconductor device exhibits a favorable die shear strength and a favorable connection reliability. From the viewpoint of facilitating the obtainment of the above-described effects, the content of the submicro copper particles may be 30% by mass or more and 85% by mass or less, may be 35% by mass or more and 85% by mass or less, or may be 40% by mass or more and 80% by mass or less of the sum of the mass of the submicro copper particles and the mass of the micro copper particles.

The shape of the submicro copper particle is not particularly limited. Examples of the shape of the submicro copper particle include a spherical shape, a block shape, a needle shape, a flake shape, a substantially spherical shape, and an aggregate thereof. From the viewpoint of dispersibility and a filling property, the shape of the submicro copper particle may be a spherical shape, a substantially spherical shape, or a flake shape, and, from the viewpoint of combustibleness, dispersibility, a property of mixing with a flake-shaped micro copper particle, and the like, the shape of the submicro copper particle may be a spherical shape or a substantially spherical shape. The scope of the "flake shape" in the present specification includes flat sheet-like shapes such as a sheet shape and a scale shape.

From the viewpoint of dispersibility, the filling property, and the property of mixing with a flake-shaped micro copper particle, the aspect ratio of the submicro copper particle may be 5 or less or may be 3 or less. The "aspect ratio" in the present specification refers to the ratio of the long side to the thickness of a particle. The long side and the thickness of a particle can be measured from, for example, a SEM image of the particle.

The submicro copper particles may be treated with a specific surface treatment agent. Examples of the specific surface treatment agent include organic acids having 8 to 16 carbon atoms. Examples of the organic acids having 8 to 16 carbon atoms include saturated fatty acids such as caprylic acid, methylheptanoic acid, ethylhexanoic acid, propylpentanoic acid, pelargonic acid, methyloctanoic acid, ethylheptanoic acid, propylhexanoic acid, capric acid, methylnonanoic acid, ethyloctanoic acid, propylheptanoic acid, butylhexanoic acid, undecanoic acid, methyldecanoic acid, ethylnonanoic acid, propyloctanoic acid, butylheptanoic acid, lauric acid, methylundecanoic acid, ethyldecanoic acid, propylnonanoic acid, butyloctanoic acid, pentylheptanoic acid, tridecanoic acid, methyldodecanoic acid, ethylundecanoic acid, propyldecanoic acid, butylnonanoic acid, pentyloctanoic acid, myristic acid, methyl tridecanoic acid, ethyl dodecanoic acid, propyl undecanoic acid, butyl decanoic acid, pentyl nonanoic acid, hexyl octanoic acid, pentadecanoic acid, methyl tetradecanoic acid, ethyl tridecanoic acid, propyl dodecanoic acid, butyl undecanoic acid, pentyldecanoic acid, hexylnonanoic acid, palmitic acid, methylpentadecanoic acid, ethyltetradecanoic acid, propyltridecanoic acid, butyldodecanoic acid, pentylundecanoic acid, hexyldecanoic acid, heptylnonanoic acid, methylcyclohexanecarboxylic acid, ethyl cyclohexane carboxylic acid, propyl cyclohexane carboxylic acid, butyl cyclohexane carboxylic acid, pentyl cyclohexane carboxylic acid, hexyl cyclohexane carboxylic acid, heptyl cyclohexane carboxylic acid, octyl cyclohexane carboxylic acid, and nonyl cyclohexane carboxylic acid; unsaturated fatty acids such as octenoic acid, nonenoic acid, methylnonenoic acid, decenoic acid, undecenoic acid, dodecenoic acid, tridecenoic acid, tetradecenoic acid, myristoleic acid, pentadecenoic acid, hexadecenoic acid, palmitoleic acid, and sabic acid; and aromatic carboxylic acid such as terephthalic acid, pyromellitic acid, o-phenoxybenzoic acid, methylbenzoic acid, ethylbenzoic acid, propylbenzoic acid, butylbenzoic acid, pentylbenzoic acid, hexylbenzoic acid, heptylbenzoic acid, octylbenzoic acid, and nonylbenzoic acid. One kind of organic acid may be used singly or two or more kinds of organic acids may be used in combination. When the above-described organic acid and the submicro copper particles are combined together, there is a tendency that both the dispersibility of the submicro copper particles and the desorption property of the organic acid during sintering can be satisfied.

The treatment amount of the surface treatment agent may be an amount in which one molecule layer to three molecule layers of the surface treatment agent are attached to the surfaces of the submicro copper particles. This amount can be computed from the number (n) of molecule layers attached to the surface of the submicro copper particle, the specific surface area ($A_p$) (unit: m$^2$/g) of the submicro copper particle, the molecular weight ($M_s$) (unit: g/mol) of the surface treatment agent, the minimum coating area ($S_s$) (unit: m$^2$/particle) of the surface treatment agent, and the Avogadro's number ($N_A$) ($6.02 \times 10^{23}$). Specifically, the treatment amount of the surface treatment agent is computed according to an expression of the treatment amount (% by mass) of the surface treatment agent=$\{(n \cdot A_p \cdot M_s)/(S_s \cdot N_A + n \cdot A_p \cdot M_s)\} \times 100$.

The specific surface area of the submicro copper particles can be computed by measuring dried submicro copper particles using a BET specific surface area measurement method. The minimum coating area of the surface treatment agent is $2.05 \times 10^{-19}$ m$^2$/molecule in a case in which the surface treatment agent is a linear saturated fatty acid. In a case in which the surface treatment agent is a surface treatment agent other than the linear saturated fatty acid, the minimum coating area can be measured using a method described in, for example, the calculation from a molecular model or "Chemistry and Education" (Katsuhiro Ueda, Sumio Inafuku, Shingen, 40(2), 1992, pp. 114 to 117). An example of a quantitative method of the surface treatment agent will be described. The surface treatment agent can be identified using a thermal desorption gas-gas chromatograph-mass analyzer of a dried powder obtained by removing the dispersion medium from the copper paste for joining, which enables the determination of the number of carbon atoms in the surface treatment agent and the molecular weight of the surface treatment agent. The proportion of a carbon component in the surface treatment agent can be analyzed by a carbon component analysis. Examples of a carbon component analysis method include a high-frequency induction heating furnace combustion/infrared absorption method. The amount of the surface treatment agent can be computed from the number of carbon atoms, the molecular weight, and the proportion of a carbon component in the identified surface treatment agent using the above-described expression.

The treatment amount of the surface treatment agent may be 0.07% by mass or more and 2.1% by mass or less, may be 0.10% by mass or more and 1.6% by mass or less, or may be 0.2% by mass or more and 1.1% by mass or less.

The submicro copper particles have a favorable sinterability, and thus it is possible to reduce problems of a high synthesis cost, non-favorable dispersibility, a decrease in volume shrinkage after sintering, and the like which are observed in joining materials mainly including copper nanoparticles.

As the submicro copper particles according to the present embodiment, a commercially available product can be used. Examples of the commercially available submicro copper particles include CH-0200 (manufactured by Mitsui Mining & Smelting Co., Ltd., volume-average particle diameter: 0.36 μm), HT-14 (manufactured by Mitsui Mining & Smelting Co., Ltd., volume-average particle diameter: 0.41 μm), CT-500 (manufactured by Mitsui Mining & Smelting Co., Ltd., volume-average particle diameter: 0.72 μm), and Tn-Cu100 (manufactured by Taiyo Nippon Sanso Corporation, volume-average particle diameter: 0.12 μm).

(Micro Copper Particles)

As the micro copper particles, micro copper particles including copper particles having a particle diameter of 2 μm or more and 50 μm or less are exemplified, and, for example, copper particles having a volume-average particle diameter of 2 μm or more and 50 μm or less can be used. When the volume-average particle diameter of the micro copper particles is in the above-described range, it is possible to sufficiently reduce volume shrinkage when the copper paste for joining has been sintered, it becomes easy to ensure the joining strength of a joined body that is manufactured by sintering the copper paste for joining, and, in a case in which the copper paste for joining is used to join a semiconductor element, there is a tendency that a semiconductor device exhibits a favorable die shear strength and a favorable connection reliability. From the viewpoint of the ease of obtaining the above-described effects, the volume-average particle diameter of the micro copper particles may be 3 μm or more and 20 μm or less or may be 3 μm or more and 10 μm or less.

The content of the micro copper particles may be 10% by mass or more and 90% by mass or less, may be 15% by mass or more and 65% by mass or less, or may be 20% by mass or more and 60% by mass or less of the sum of the masses of the copper particles and the second particles. When the content of the micro copper particles is in the above-described range, it becomes easy to ensure the joining strength of a joined body that is manufactured by sintering the copper paste for joining, and, in a case in which the copper paste for joining is used to join a semiconductor element, there is a tendency that a semiconductor device exhibits a favorable die shear strength and a favorable connection reliability.

The sum of the content of the submicro copper particles and the content of the micro copper particles can be set to 80% by mass or more of the sum of the masses of the copper particles and the second particles. When the sum of the content of the submicro copper particles and the content of the micro copper particles is in the above-described range, it is possible to sufficiently reduce volume shrinkage when the copper paste for joining has been sintered, it becomes easy to ensure the joining strength of a joined body that is manufactured by sintering the copper paste for joining, and, in a case in which the copper paste for joining is used to join a semiconductor element, there is a tendency that a semiconductor device exhibits a favorable die shear strength and a favorable connection reliability. From the viewpoint of the ease of obtaining the above-described effects, the sum of the content of the submicro copper particles and the content of the micro copper particles may be 90% by mass or more, may be 95% by mass or more, or may be 99.99% by mass or more of the sum of the masses of the copper particles and the second particles.

The shape of the micro copper particle is not particularly limited. Examples of the shape of the micro copper particle include a spherical shape, a block shape, a needle shape, a flake shape, a substantially spherical shape, and an aggregate thereof. Among these, the shape of the micro copper particle is preferably a flake shape. When flake-shaped micro copper particles are used, the micro copper particles in the copper paste for joining are oriented substantially parallel to a surface to be attached, and thus it is possible to suppress volume shrinkage occurring when the copper paste for joining has been sintered, and it becomes easy to ensure the joining strength of a joined body that is manufactured by sintering the copper paste for joining In a case in which the copper paste for joining is used to join a semiconductor element, there is a tendency that a semiconductor device exhibits a favorable die shear strength and a favorable connection reliability. From the viewpoint of the ease of obtaining the above-described effects, particularly, the aspect ratio of the flake-shaped micro copper particle may be 4 or more or may be 6 or more.

For the micro copper particles, the presence or absence of the treatment using the surface treatment agent is not particularly limited. From the viewpoint of the dispersion stability and the oxidation resistance, the micro copper particles may be treated with a surface treatment agent. The surface treatment agent may be removed during joining Examples of the above-described surface treatment agent include fatty carboxylic acids such as palmitic acid, stearic acid, arachidic acid, and oleic acid; aromatic carboxylic acids such as terephthalic acid, pyromellitic acid, and o-phenoxybenzoic acid; fatty alcohols such as cetyl alcohol, stearyl alcohol, isobornyl cyclohexanol, and tetraethylene glycol; aromatic alcohols such as p-phenylphenol; alkylamines such as octylamine, dodecylamine, and stearylamine; fatty nitriles such as stearonitrile and decanenitrile; silane coupling agents such as alkyl alkoxysilane; polymer treatment agents such as polyethylene glycol, polyvinyl alcohol, polyvinyl pyrrolidone, and silicone oligomer; and the like. One kind of surface treatment agent may be used singly or two or more kinds of surface treatment agents may be jointly used.

The treatment amount of the surface treatment agent may be an amount of one molecule layer or more on the surfaces of the particles. The above-described treatment amount of the surface treatment agent changes depending on the specific surface area of the micro copper particle, the molecular weight of the surface treatment agent, and the minimum coating area of the surface treatment agent. The treatment amount of the surface treatment agent is generally 0.001% by mass or more. The specific surface area of the micro copper particle, the molecular weight of the surface treatment agent, and the minimum coating area of the surface treatment agent can be computed using the above-described methods.

In a case in which the copper paste for joining is prepared using the submicro copper particles alone, volume shrinkage and sintering shrinkage caused by the drying of the dispersion medium are significant, and thus the copper paste for joining is easily peeled off from the surface to be attached during the sintering of the copper paste for joining, and it is difficult to obtain a sufficient die shear strength and a sufficient connection reliability in the joining of a semiconductor element or the like. When the submicro copper particles and the micro copper particles are jointly used, volume shrinkage during the sintering of the copper paste for joining is suppressed, and a joined body can be provided with a sufficient joining strength. In a case in which the copper paste for joining is used to join a semiconductor element, an effect of a semiconductor device exhibiting a favorable die shear strength and a favorable connection reliability is obtained.

As the micro copper particles according to the present embodiment, a commercially available product can be used. Examples of the commercially available micro copper particles include MA-C025 (manufactured by Mitsui Mining & Smelting Co., Ltd., volume-average particle diameter: 7.5 µm), 3L3 (manufactured by Fukuda Metal Foil & Powder Co., Ltd., volume-average particle diameter: 8.0 µm), 1110F (manufactured by Mitsui Mining & Smelting Co., Ltd., volume-average particle diameter: 3.8 µm), and HWQ3.0 µm (manufactured by Fukuda Metal Foil & Powder Co., Ltd., volume-average particle diameter: 3.0 µm).

(Second Particles)

The second particles according to the present embodiment need to be particles which serve as a sintering aid, are capable of decreasing the sintering temperature of the copper paste for joining, and include a metal element other than copper. Meanwhile, "particles including a metal element other than copper" in the present specification may be any particles including at least one kind of metal element other than copper and do not exclude particles including copper (for example, an alloy of copper and another metal). As the second particles, metal particles or fatty acid metal salt particles are exemplified.

The metal particles are not particularly limited, but are preferably metal particles including at least one kind of metal selected from the group consisting of zinc, silver, gold, platinum, tin, indium, vanadium, aluminum, nickel, antimony, and palladium. From the viewpoint of a more favorable effect as a sintering aid, the metal particles are preferably metal particles including at least one kind of metal selected from the group consisting of zinc, silver, gold, platinum, nickel, and palladium. From the viewpoint of an excellent material cost, the metal particles are preferably metal particles including at least one kind of metal selected from the group consisting of zinc, silver, tin, indium, and vanadium. From the viewpoint of further improving the die shear strength with respect to noble metal such as gold, silver, and palladium and the connection reliability, the metal particles are preferably metal particles including at least one kind of metal selected from the group consisting of zinc, silver, and gold. Among these, from the viewpoint of an excellent material cost, metal particles including zinc or silver are more preferred, and zinc particles are more preferred.

The scope of the metal particles including the above-described metal also include metal particles including the above-described metal as an alloy. As an alloy described above, brass, brass hammer, cupronickel, albata, bronze, and the like are exemplified.

Examples of the shape of the metal particle include a spherical shape, a block shape, a needle shape, a flake shape, a substantially spherical shape, and an aggregate thereof. From the viewpoint of increasing the number of contact points with the copper particles, a shape having a large specific surface area is preferred. From the viewpoint of satisfying both the ease of the metal particles being melted into the copper particles during sintering and the oxidation resistance, the shape of the metal particle is preferably a flake shape. The aspect ratio of the flake-shaped metal particle is preferably 4 or more and more preferably 6 or more.

For the metal particles, the presence or absence of the treatment using the surface treatment agent is not particularly limited. From the viewpoint of the dispersion stability and oxidation prevention, the metal particles may be treated with a surface treatment agent. The surface treatment agent may be removed during joining Examples of the above-described surface treatment agent include fatty carboxylic acids such as palmitic acid, stearic acid, arachidic acid, and oleic acid; aromatic carboxylic acids such as terephthalic acid, pyromellitic acid, and o-phenoxybenzoic acid; fatty alcohols such as cetyl alcohol, stearyl alcohol, isobornyl cyclohexanol, and tetraethylene glycol; aromatic alcohols such as p-phenylphenol; alkylamines such as octylamine, dodecylamine, and stearylamine; fatty nitriles such as stearonitrile and decanenitrile; silane coupling agents such as alkyl alkoxysilane; polymer treatment agents such as polyethylene glycol, polyvinyl alcohol, polyvinyl pyrrolidone, and silicone oligomer; and the like. One kind of surface treatment agent may be used singly or two or more kinds of surface treatment agents may be used in combination.

The fatty acid metal salt particles preferably include an fatty acid metal salt of an fatty acid having 8 to 18 carbon atoms and silver, nickel, or zinc. Specifically, silver stearate, zinc stearate, zinc laurate, nickel laurate, zinc octylate, and the like are exemplified. There are cases in which these fatty acid metal salt particles are unintentionally included due to a reaction between the organic acid added as the surface protective agent and a metal oxide on the surfaces of the metal particles.

For the second particle, from the viewpoint of obtaining the contact area with a member being used for joining, the volume-average particle diameter of primary particles may be 150 µm or less, may be 100 µm or less, may be 50 µm or less, may be 20 µm or less, may be 5 µm or less, or may be 3 µm or less. For the second particles, from the viewpoint of preventing oxidation, the volume-average particle diameter of the primary particles is preferably 0.05 µm or more.

From the viewpoint of obtaining a sufficient joining property, the content of the second particles may be 0.01% by mass or more, may be 0.05% by mass or more, or may be 0.1% by mass or more of the sum of the masses of the copper particles and the second particles. The content of the second particles may be 10% by mass or less, may be 3% by mass or less, or may be 1% by mass or less.

As the second particles according to the present embodiment, a commercially available product can be used. Examples of the commercially available second particles include the following particles.

Zinc (product No.: 13789, manufactured by Alfa Aesar, 325 mesh, volume-average particle diameter: approximately 45 µm)

Silver powder (AgC-239, product No.: 13789, manufactured by Fukuda Metal Foil & Powder Co., Ltd., volume-average particle diameter: 2.5 µm)

Tin powder (product No.: 576883-5G manufactured by Sigma-Aldrich Japan, volume-average particle diameter: 0.15 µm or less)

Indium (product No.: 264032-5G manufactured by Sigma-Aldrich Japan, 100 mesh, volume-average particle diameter: approximately 149 µm)

Gold (product No.: 44636, manufactured by Alfa Aesar, volume-average particle diameter: 0.5 to 0.8 µm)

Palladium (product No.: 12068, manufactured by Alfa Aesar, 200 mesh, volume-average particle diameter: approximately 74 µm)

Vanadium (product No.: 12234, manufactured by Alfa Aesar, 325 mesh, volume-average particle diameter: approximately 45 µm)

Aluminum (product No.: 45031, manufactured by Alfa Aesar, volume-average particle diameter: 11 μm)

Antimony (manufactured by Wako Pure Chemical Corporation, volume-average particle diameter: 100 μm)

Nickel (manufactured by Fukuda Metal Foil & Powder Co., Ltd., volume-average particle diameter: 5 μm)

Zinc stearate 1.5 μm (Wako special grade, manufactured by Wako Pure Chemical Corporation, lot No.: LAF3346, average particle diameter: 0.8 μm)

(Dispersion Medium)

The dispersion medium is not particularly limited and may be a volatile dispersion medium. Examples of the volatile dispersion medium include monohydric and polyhydric alcohols such as pentanol, hexanol, heptanol, octanol, decanol, ethylene glycol, diethylene glycol, propylene glycol, butylene glycol, α-terpineol, and isobornyl cyclohexanol (MTPH); ethers such as ethylene glycol butyl ether, ethylene glycol phenyl ether, diethylene glycol methyl ether, diethylene glycol ethyl ether, diethylene glycol butyl ether, diethylene glycol isobutyl ether, diethylene glycol hexyl ether, triethylene glycol methyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether; esters such as ethylene glycol ethyl ether acetate, ethylene glycol butyl ether acetate, ethylene glycol butyl ether acetate, diethylene glycol ethyl ether acetate, diethylene glycol butyl ether acetate, dipropylene glycol methyl ether acetate (DPMA), ethyl lactate, butyl lactate, γ-butyrolactone, and propylene carbonate; acid amides such as N-methyl-2-pyrrolidone, N,N-dimethylacetamide, and N,N-dimethylformamide; fatty hydrocarbons such as cyclohexane, octane, nonane, decane, and undecane; aromatic hydrocarbons such as benzene, toluene, and xylene; mercaptans having an alkyl group having 1 to 18 carbon atoms; and mercaptans having a cycloalkyl group having 5 to 7 carbon atoms. Examples of the mercaptans having an alkyl group having 1 to 18 carbon atoms include ethyl mercaptan, n-propyl mercaptan, i-propyl mercaptan, n-butyl mercaptan, i-butyl mercaptan, t-butyl mercaptan, pentyl mercaptan, hexyl mercaptan, and dodecyl mercaptan. Examples of the mercaptans having a cycloalkyl group having 5 to 7 carbon atoms include cyclopentyl mercaptan, cyclohexyl mercaptan, and cycloheptyl mercaptan.

The content of the dispersion medium may be 5 to 50 parts by mass when the sum of the masses of the copper particles and the second particles is set to 100 parts by mass. When the content of the dispersion medium is in the above-described range, it is possible to adjust the copper paste for joining to a more appropriate viscosity, and the sintering of the copper particles is not easily inhibited.

(Additive)

To the copper paste for joining, a wetting enhancer such as a nonionic surfactant and a fluorine-based surfactant; a defoamer such as a silicone oil; an ion trapping agent such as an inorganic ion exchanger; and the like may be added as necessary.

As an aspect of the copper paste for joining of the present embodiment, a copper paste for joining in which the copper particles include submicro copper particles having a volume-average particle diameter of 0.12 μm or more and 0.8 μm or less, preferably, 0.15 μm or more and 0.8 μm or less and micro copper particles having a volume-average particle diameter of 2 μm or more and 50 μm or less, the sum of the content of the submicro copper particles and the content of the micro copper particles is 80% by mass or more of the sum of the masses of the copper particles and the second particles, the content of the submicro copper particles is 30% by mass or more and 90% by mass or less of the sum of the mass of the submicro copper particles and the mass of the micro copper particles, and the content of the second particles is 0.01% by mass or more and 10% by mass or less of the sum of the masses of the copper particles and the second particles.

As the copper paste for joining, a copper paste for joining which is obtained by blending submicro copper particles having a volume-average particle diameter of 0.12 μm or more and 0.8 μm or less, preferably, 0.15 μm or more and 0.8 μm or less, micro copper particles having a volume-average particle diameter of 2 μm or more and 50 μm or less, second particles, a dispersion medium, and other components described above as necessary, in which the sum of the amount of the submicro copper particles blended and the amount of the micro copper particles blended is 80% by mass or more of the sum of the masses of the copper particles and the second particles, the amount of the submicro copper particles blended is 30% by mass or more and 90% by mass or less of the sum of the amount of the submicro copper particles blended and the amount of the micro copper particles blended, and the content of the second particles is 0.01% by mass or more and 10% by mass or less of the sum of the masses of the copper particles and the second particles.

In addition, as another aspect of the copper paste for joining of the present embodiment, a copper paste for joining containing, as the submicro copper particles, copper particles having a particle diameter of 0.12 μm or more and 0.8 μm or less, preferably, 0.15 μm or more and 0.8 μm or less are included in a content of 24 to 80% by mass of the total mass of the copper particles and, as the micro copper particles, micro copper particles having a particle diameter of 2 μm or more and 50 μm or less are included in a content of 8 to 70% by mass of the total mass of the copper particles, in which the content of the submicro copper particles is 30% by mass or more and 90% by mass or less of the sum of the mass of the submicro copper particles and the mass of the micro copper particles, and the content of the second particles is 0.01% by mass or more and 10% by mass or less of the sum of the masses of the copper particles and the second particles. The particle diameter mentioned herein refers to the maximum particle diameter and is obtained using a method in which the copper particles which serve as the raw material or dried copper particles obtained by removing a volatile component from the copper paste for joining are observed using a scanning electron microscope (SEM).

In a case in which the copper particle does not have a spherical shape, the particle diameter can be obtained as the maximum particle diameter using the following method. A method for computing the long diameter of a copper particle from a SEM image will be exemplified. A powder of the copper particle is placed on carbon tape for SEM using a spatula, thereby producing a sample for SEM. This sample for SEM is observed using a SEM device at a magnification of 100 to 5,000 times. A rectangle circumscribing the copper particle in this SEM image is drawn using image processing software, and the long side of the rectangle is considered as the long diameter of the particle.

(Preparation of Copper Paste for Joining)

The copper paste for joining can be prepared by mixing the submicro copper particles, the micro copper particles, the second particles, and an arbitrary additive to the dispersion medium. After the mixing of the respective components, a stirring treatment may be carried out. For the copper paste for joining, the maximum particle diameter of a dispersion liquid may be adjusted by a classification operation.

The copper paste for joining may be prepared by mixing the submicro copper particles, the surface treatment agent, and the dispersion medium in advance, carrying out a dispersion treatment so as to prepare a dispersion liquid of the submicro copper particles, and furthermore, mixing the micro copper particles, the second particles, and an arbitrary additive into the dispersion liquid. When the copper paste for joining is prepared in an order described above, the dispersibility of the submicro copper particles improves and thus the mixing property with the micro copper particles becomes favorable, and the performance of the copper paste for joining further improves. An aggregated substance may be removed from the dispersion liquid of the submicro copper particles by a classification operation.

The stirring treatment can be carried out using a stirrer. Examples of the stirrer include a rotation and revolution-type stirring device, a Leica machine, a twin screw kneader, a three-roll mill, a planetary mixer, and a thin layer shear disperser.

The classification operation can be carried out using, for example, filtration, spontaneous precipitation, or centrifugal separation. Examples of a filter for filtration include a metal mesh, a metal filter, and a nylon mesh.

Examples of the dispersion treatment include a thin layer shear disperser, a beads mill, an ultrasonic homogenizer, a high shear mixer, a narrow gap three-roll mill, a wet-type ultra-atomizing device, a supersonic jet mill, and an ultra-high-pressure homogenizer.

In the case of being molded, the copper paste for joining may be adjusted to a viscosity suitable for individual printing and coating methods. As the viscosity of the copper paste for joining, for example, the Casson viscosity at 25° C. may be 0.05 Pa·s or more and 2.0 Pa·s or less or may be 0.06 Pa·s or more and 1.0 Pa·s or less.

According to the copper paste for joining of the present embodiment, the submicro copper particles and the micro copper particles are jointly used in predetermined proportions, and thus a favorable sinterability can be obtained, and volume shrinkage during sintering can be suppressed. Furthermore, the copper paste for joining includes the second particles including a metal element other than copper, and thus it is possible to obtain a sintered body in which a plurality of kinds of metal forms a solid solution or is dispersed, and thus the mechanical characteristics such as yield stress and fatigue strength of the sintered body are improved, the die shear strength and the connection reliability easily improve, and the joining property with respect to noble metal also further improves. Therefore, the copper paste for joining of the present embodiment is capable of ensuring a joining force with a member without excessive pressurization, and a joined body that is manufactured by sintering the copper paste for joining can be provided with a sufficient joining strength. In a case in which the copper paste for joining is used to join a semiconductor element, a semiconductor device is capable of exhibiting a favorable die shear strength and a favorable connection reliability. That is, the copper paste for joining of the present embodiment may be used as a joining material for non-pressurization joining In addition, according to the copper paste for joining of the present embodiment, relatively inexpensive copper particles are used, and thus it is possible to suppress the manufacturing costs, and the mass production is possible. Particularly, the copper paste for joining of the present embodiment is capable of obtaining the above-described effects due to the submicro copper particles and the micro copper particles and thus has an advantage that the copper paste for joining can be more stably supplied at a lower cost compared with joining materials including expensive copper nanoparticles as a main component. Therefore, it becomes possible to further enhance production stability in the case of manufacturing joined bodies such as semiconductor devices.

<Joined Body and Semiconductor Device>

Hereinafter, a preferred embodiment will be described in detail with reference to drawings. Meanwhile, in the drawings, the same or corresponding part will be given the same reference sign and will not be described again. In addition, the dimensional ratios in the drawings are not limited to the ratios illustrated in the drawings.

FIG. 1 is a schematic cross-sectional view illustrating an example of a joined body manufactured using the copper paste for joining of the present embodiment. A joined body 100 of the present embodiment includes a first member 2, a second member 3, and a sintered body 1 of the copper paste for joining which joins the first member and the second member.

Examples of the first member 2 and the second member 3 include semiconductor elements such as IGBT, diodes, Schottky barrier diodes, MOS-FET, thyristors, logic circuits, sensors, analog integrated circuits, LED, semiconductor lasers, and oscillators, base materials for mounting a semiconductor element such as lead frames, metal sheet-attached ceramic substrates (for example, DBC), and LED packages, members for power supply such as copper ribbons, metal blocks, and terminals, heat dissipation sheets, water cooling sheets, and the like.

The first member 2 and the second member 3 are capable of including metal forming a metallic bond with the sintered body 1 of the copper paste for joining on surfaces 4a and 4b in contact with the sintered body 1 of the copper paste for joining Examples of the metal include copper, nickel, silver, gold, palladium, platinum, lead, tin, cobalt, and the like. One kind of metal may be used singly or two or more kinds of metal may be used in combination. In addition the surfaces in contact with the sintered body may be an alloy including the above-described metal. As metal that is used in the alloy, in addition to the above-described metal, zinc, manganese, aluminum, beryllium, titanium, chromium, iron, molybdenum, and the like are exemplified. Examples of a member in which the surfaces in contact with the sintered body are metal include members having a variety of metal plates, wires, chips having a metal plate, heat spreaders, ceramic substrates to which a metal sheet is attached, lead frames having a variety of metal plates, lead frames made of a variety of metal, copper sheets, and copper foils.

From the viewpoint of sufficiently joining the first member and the second member, the die shear strength of the joined body may be 10 MPa or more, may be 15 MPa or more, may be 20 MPa or more, or may be 30 MPa or more. The die shear strength can be measured using a universal bond tester (4000 series, manufactured by Nordson Dage) or the like.

From the viewpoint of the heat dissipation property and the connection reliability at a high temperature, the thermal conductivity of the sintered body of the copper paste for joining may be 100 W/(m·K) or more, may be 120 W/(m·K)

or more, or may be 150 W/(m·K) or more. The thermal conductivity can be computed from the thermal diffusivity, the specific heat capacity, and the density of the sintered body of the copper paste for joining Hereinafter, a method for manufacturing a joined body using the copper paste for joining of the present embodiment will be described.

The method for manufacturing a joined body using the copper paste for joining of the present embodiment includes a step of preparing a laminate in which the first member, the copper paste for joining, and the second member are laminated in this order in a direction in which the weight of the first member applies and sintering the copper paste for joining in a state in which the copper paste for joining receives the weight of the first member or the weight of the first member and a pressure of 0.01 MPa or less. The direction in which the weight of the first member applies can also be referred to as the direction in which the gravitational force applies.

The laminate can be prepared by, for example, providing the copper paste for joining of the present embodiment in a necessary portion of the second member and then disposing the first member on the copper paste for joining A method for providing the copper paste for joining of the present embodiment in a necessary portion of the second member may be a method in which the copper paste for joining can be deposited. As the above-described method, for example, screen printing, transfer printing, offset printing, a jet printing method, a dispenser, a jet dispenser, a needle dispenser, a comma coater, a slit coater, a die coater, a gravure coater, a slit coat, anastatic printing, intaglio printing, gravure printing, stencil printing, soft lithography, bar coating, an applicator, a particle deposition method, a spray coater, a spin coater, a dip coater, electrodeposition coating, and the like can be used. The thickness of the copper paste for joining may be 1 μm or more, may be 5 μm or more, may be 10 μm or more, or may be 20 μm or more. In addition, the thickness of the copper paste for joining may be 3,000 μm or less, may be 1,000 μm or less, may be 500 μm or less, may be 300 μm or less, may be 250 μm or less, may be 200 μm or less, or may be 150 μm or less.

The copper paste for joining provided on the second member may be appropriately dried from the viewpoint of suppressing the flow or the generation of voids during the sintering. The gas atmosphere during the drying may be the atmosphere, may be an oxygen-free atmosphere of nitrogen, rare gas, or the like, or may be a reducing atmosphere of hydrogen, formic acid, or the like. The drying method may be drying by leaving the copper paste for joining at normal temperature, may be drying by heating, or may be drying at reduced pressure. In the case of the drying by heating or the drying at reduced pressure, it is possible to use, for example, a hot plate, a hot-air dryer, a hot-air heating furnace, a nitrogen dryer, an infrared dryer, an infrared heating furnace, a far-infrared heating furnace, a microwave heating device, a laser heating device, an electromagnetic heating device, a heater heating device, a steam heating furnace, a hot plate pressing machine, or the like. The temperature and the time during the drying may be appropriately adjusted depending on the kind and amount of the dispersion medium used. Regarding the temperature and the time during the drying, the copper paste for joining may be dried at 50° C. or higher and 180° C. or lower for 1 minute or longer and 120 minutes or shorter.

Examples of a method for disposing the first member on the copper paste for joining include a chip mounter, a flip chip bonder, and a carbon or ceramic positioning jig.

The copper paste for joining is sintered by carrying out a heating treatment on the laminate. For the heating treatment, it is possible to use, for example, a hot plate, a hot-air dryer, a hot-air heating furnace, a nitrogen dryer, an infrared dryer, an infrared heating furnace, a far-infrared heating furnace, a microwave heating device, a laser heating device, an electromagnetic heating device, a heater heating device, a steam heating furnace, or the like.

From the viewpoint of suppressing the oxidation of the sintered body, the first member, and the second member, the gas atmosphere during the sintering may be an oxygen-free atmosphere. From the viewpoint of removing the surface oxide of the copper particles in the copper paste for joining, the gas atmosphere may be a reducing atmosphere. Examples of the oxygen-free atmosphere include the introduction of an oxygen-free gas such as nitrogen or rare gas or a vacuum. Examples of the reducing atmosphere include an atmosphere filled with pure hydrogen gas, an atmosphere filled with a gas mixture of hydrogen and nitrogen which represent forming gas, an atmosphere filled with nitrogen including formic acid gas, an atmosphere filled with a gas mixture of hydrogen and rare gas, an atmosphere filled with rare gas including formic acid gas, and the like.

From the viewpoint of reducing thermal damage on the first member and the second member and improving the yield ratio, the peak temperature during the heating treatment may be 250° C. or higher and 450° C. or lower, may be 250° C. or higher and 400° C. or lower, may be 250° C. or higher and 350° C. or lower, or may be 250° C. or higher and 300° C. or lower. When the peak temperature is 200° C. or higher, there is a tendency that sintering sufficiently progresses for a peak temperature-holding time of 60 minutes or shorter.

From the viewpoint of volatilizing all of the dispersion medium and improving the yield ratio, the peak temperature-holding time may be 1 minute or longer and 60 minutes or shorter, may be 1 minute or longer and shorter than 40 minutes, or may be 1 minute or longer and shorter than 30 minutes.

When the laminate is sintered using the copper paste for joining of the present embodiment, the joined body can be provided with a sufficient joining strength even when the surface to be attached includes at least one kind of metal selected from the group consisting of copper, nickel, tin, gold, silver, platinum, and palladium. That is, a sufficient joining strength can be obtained in a state in which the copper paste for joining receives the weight of the first member laminated on the copper paste for joining or the weight of the first member plus a pressure of 0.01 MPa or less, preferably, 0.005 MPa or less. When the pressure that the copper paste for joining receives during the sintering is in the above-described range, a special pressurization device is not required, and thus it is possible to reduce voids and further improve the die shear strength and the connection reliability without impairing the yield ratio. Examples of a method for subjecting the copper paste for joining to a pressure of 0.01 MPa or less include a method in which a weight is placed on the first member and the like.

In the joined body, at least one of the first member and the second member may be a semiconductor element. Examples of the semiconductor element include a power module made up of a diode, a rectifier, a thyristor, a MOS gate driver, a power switch, power MOSFET, IGBT, a Schottky diode, a fast recovery diode, or the like, a transmitter, an amplifier, an LED module, and the like. In the above-described case, the joined body becomes a semiconductor device. A semiconductor device to be obtained can be provided with a sufficient die shear strength and a sufficient connection reliability.

Figure 2:
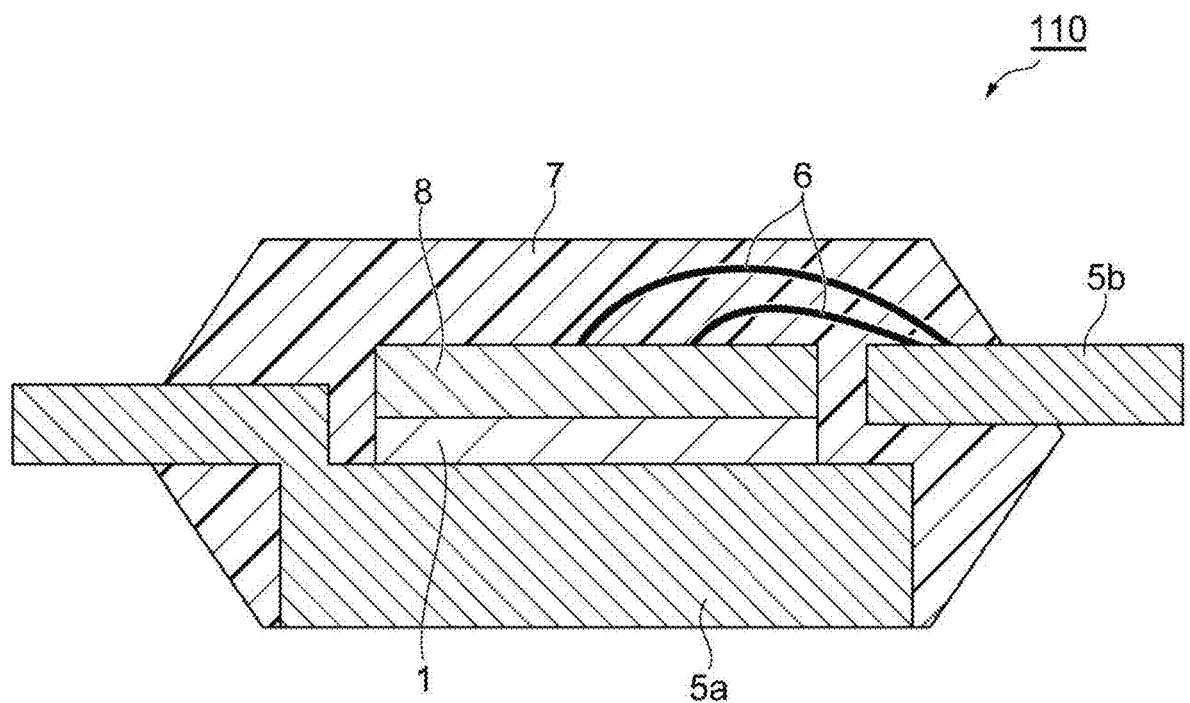
FIG. 2 is a schematic cross-sectional view illustrating an example of a semiconductor device manufactured using a copper paste for joining of the present embodiment.

FIG. 2 is a schematic cross-sectional view illustrating an example of a semiconductor device manufactured using the copper paste for joining of the present embodiment. A semiconductor device 110 illustrated in FIG. 2 is made up of a semiconductor element 8 connected through the sintered body 1 of the copper paste for joining according to the present embodiment on a lead frame 5a and a mold resin 7 that molds the semiconductor element and the lead frame. The semiconductor element 8 is connected to a lead frame 5b through a wire 6.

Examples of the semiconductor device manufactured using the copper paste for joining of the present embodiment include a power module made up of a diode, a rectifier, a thyristor, a MOS gate driver, a power switch, power MOSFET, IGBT, a Schottky diode, a fast recovery diode, or the like, a transmitter, an amplifier, a high-brightness LED module, a sensor, and the like.

The semiconductor device can be manufactured in the same manner as the above-described method for manufacturing a joined body. That is, a method for manufacturing the semiconductor device includes a step of preparing a laminate in which a semiconductor element is used as at least one of the first member and the second member, and the first member, the copper paste for joining, and the second member are laminated in this order in a direction in which the weight of the first member applies and sintering the copper paste for joining in a state in which the copper paste for joining receives the weight of the first member or the weight of the first member and a pressure of 0.01 MPa or less. Examples thereof include a step of providing the copper paste for joining on the lead frame 5a and disposing and heating the semiconductor element 8. A semiconductor device to be obtained can be provided with a sufficient die shear strength and a sufficient connection reliability even in a case in which the first member and the second member are joined without pressurization. The semiconductor device of the present embodiment has a sufficient joining force and includes a copper sintered body having a high thermal conductivity and a high melting point, and thus the semiconductor device has a sufficient die shear strength, is excellent in terms of the connection reliability, and can also become excellent in power cycle resistance.

EXAMPLES

Hereinafter, the present invention will be described more specifically using examples. However, the present invention is not limited to the following examples.

Preparation Example 1

α-Terpineol (manufactured by Wako Pure Chemical Corporation, 0.46 g) and isobornyl cyclohexanol (MTPH, manufactured by Nippon Terpene Chemicals, Inc., 0.20 g) as dispersants, CH-0200 (flake shape, manufactured by Mitsui Mining & Smelting Co., Ltd., 3.39 g) as submicro copper particles, MA-C025 (flake shape, manufactured by Mitsui Mining & Smelting Co., Ltd., 1.45 g) as micro copper particles, and lauric acid (manufactured by Wako Pure Chemical Corporation, 0.11 g) were kneaded using an agate mortar until no dried powder remained, and a liquid mixture was moved to a poly bottle. The air-tightened poly bottle was stirred at 2,000 min' (2,000 rotations/minute) for two minutes using a rotation and revolution-type stirring device (Planetary Vacuum Mixer ARV-310, manufactured by Thinky Corporation). After that, zinc stearate (manufactured by Wako Pure Chemical Corporation, 0.01 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min' (2,000 rotations/minute) for two minutes using the rotation and revolution-type stirring device (Planetary Vacuum Mixer ARV-310, manufactured by Thinky Corporation).

This liquid mixture was used as a copper paste for joining 1.

Preparation Example 2

α-Terpineol (manufactured by Wako Pure Chemical Corporation, 0.46 g) and isobornyl cyclohexanol (MTPH, manufactured by Nippon Terpene Chemicals, Inc., 0.20 g) as dispersants, CH-0200 (flake shape, manufactured by Mitsui Mining & Smelting Co., Ltd., 3.38 g) as submicro copper particles, MA-C025 (flake shape, manufactured by Mitsui Mining & Smelting Co., Ltd., 1.45 g) as micro copper particles, and lauric acid (manufactured by Wako Pure Chemical Corporation, 0.11 g) were kneaded using an agate mortar until no dried powder remained, and a liquid mixture was moved to a poly bottle. The air-tightened poly bottle was stirred at 2,000 min' (2,000 rotations/minute) for two minutes using a rotation and revolution-type stirring device (Planetary Vacuum Mixer ARV-310, manufactured by Thinky Corporation). After that, tin powder (product No.: 576883-5G, manufactured by Sigma-Aldrich Japan, 0.01 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min' (2,000 rotations/minute) for two minutes using the rotation and revolution-type stirring device (Planetary Vacuum Mixer ARV-310, manufactured by Thinky Corporation).

This liquid mixture was used as a copper paste for joining 2.

Preparation Example 3

α-Terpineol (manufactured by Wako Pure Chemical Corporation, 0.46 g) and isobornyl cyclohexanol (MTPH, manufactured by Nippon Terpene Chemicals, Inc., 0.20 g) as dispersants, CH-0200 (flake shape, manufactured by Mitsui Mining & Smelting Co., Ltd., 3.38 g) as submicro copper particles, MA-C025 (flake shape, manufactured by Mitsui Mining & Smelting Co., Ltd., 1.45 g) as micro copper particles, and lauric acid (manufactured by Wako Pure Chemical Corporation, 0.11 g) were kneaded using an agate mortar until no dried powder remained, and a liquid mixture was moved to a poly bottle. The air-tightened poly bottle was stirred at 2,000 $min^{-1}$ (2,000 rotations/minute) for two minutes using a rotation and revolution-type stirring device (Planetary Vacuum Mixer ARV-310, manufactured by Thinky Corporation). After that, indium (product No.: 264032-5G, manufactured by Sigma-Aldrich Japan, 0.01 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min' (2,000 rotations/minute) for two minutes using the rotation and revolution-type stirring device (Planetary Vacuum Mixer ARV-310, manufactured by Thinky Corporation).

This liquid mixture was used as a copper paste for joining 3.

Preparation Example 4

α-Terpineol (manufactured by Wako Pure Chemical Corporation, 0.46 g) and isobornyl cyclohexanol (MTPH, manufactured by Nippon Terpene Chemicals, Inc., 0.20 g) as dispersants, CH-0200 (flake shape, manufactured by Mitsui Mining & Smelting Co., Ltd., 3.39 g) as submicro copper particles, MA-C025 (flake shape, manufactured by Mitsui Mining & Smelting Co., Ltd., 1.45 g) as micro copper particles, and lauric acid (manufactured by Wako Pure Chemical Corporation, 0.11 g) were kneaded using an agate mortar until no dried powder remained, and a liquid mixture was moved to a poly bottle. The air-tightened poly bottle was stirred at 2,000 min' (2,000 rotations/minute) for two minutes using a rotation and revolution-type stirring device (Planetary Vacuum Mixer ARV-310, manufactured by Thinky Corporation). After that, gold (product No.: 44636, manufactured by Alfa Aesar, 0.01 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min' (2,000 rotations/minute) for two minutes using the rotation and revolution-type stirring device (Planetary Vacuum Mixer ARV-310, manufactured by Thinky Corporation).

This liquid mixture was used as a copper paste for joining 4.

Preparation Example 5

α-Terpineol (manufactured by Wako Pure Chemical Corporation, 0.46 g) and isobornyl cyclohexanol (MTPH, manufactured by Nippon Terpene Chemicals, Inc., 0.20 g) as dispersants, CH-0200 (flake shape, manufactured by Mitsui Mining & Smelting Co., Ltd., 3.38 g) as submicro copper particles, MA-C025 (flake shape, manufactured by Mitsui Mining & Smelting Co., Ltd., 1.45 g) as micro copper particles, and lauric acid (manufactured by Wako Pure Chemical Corporation, 0.11 g) were kneaded using an agate mortar until no dried powder remained, and a liquid mixture was moved to a poly bottle. The air-tightened poly bottle was stirred at 2,000 min$^{-1}$ (2,000 rotations/minute) for two minutes using a rotation and revolution-type stirring device (Planetary Vacuum Mixer ARV-310, manufactured by Thinky Corporation). After that, palladium (product No.: 12068, manufactured by Alfa Aesar, 0.01 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min' (2,000 rotations/minute) for two minutes using the rotation and revolution-type stirring device (Planetary Vacuum Mixer ARV-310, manufactured by Thinky Corporation).

This liquid mixture was used as a copper paste for joining 5.

Preparation Example 6

α-Terpineol (manufactured by Wako Pure Chemical Corporation, 0.46 g) and isobornyl cyclohexanol (MTPH, manufactured by Nippon Terpene Chemicals, Inc., 0.20 g) as dispersants, CH-0200 (flake shape, manufactured by Mitsui Mining & Smelting Co., Ltd., 3.38 g) as submicro copper particles, MA-C025 (flake shape, manufactured by Mitsui Mining & Smelting Co., Ltd., 1.45 g) as micro copper particles, and lauric acid (manufactured by Wako Pure Chemical Corporation, 0.11 g) were kneaded using an agate mortar until no dried powder remained, and a liquid mixture was moved to a poly bottle. The air-tightened poly bottle was stirred at 2,000 min' (2,000 rotations/minute) for two minutes using a rotation and revolution-type stirring device (Planetary Vacuum Mixer ARV-310, manufactured by Thinky Corporation). After that, vanadium (product No.: 12234, manufactured by Alfa Aesar, 0.01 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min' (2,000 rotations/minute) for two minutes using the rotation and revolution-type stirring device (Planetary Vacuum Mixer ARV-310, manufactured by Thinky Corporation).

This liquid mixture was used as a copper paste for joining 6.

Preparation Example 7

α-Terpineol (manufactured by Wako Pure Chemical Corporation, 0.46 g) and isobornyl cyclohexanol (MTPH, manufactured by Nippon Terpene Chemicals, Inc., 0.20 g) as dispersants, CH-0200 (flake shape, manufactured by Mitsui Mining & Smelting Co., Ltd., 3.38 g) as submicro copper particles, MA-C025 (flake shape, manufactured by Mitsui Mining & Smelting Co., Ltd., 1.45 g) as micro copper particles, and lauric acid (manufactured by Wako Pure Chemical Corporation, 0.11 g) were kneaded using an agate mortar until no dried powder remained, and a liquid mixture was moved to a poly bottle. The air-tightened poly bottle was stirred at 2,000 min' (2,000 rotations/minute) for two minutes using a rotation and revolution-type stirring device (Planetary Vacuum Mixer ARV-310, manufactured by Thinky Corporation). After that, aluminum (product No.: 45031, manufactured by Alfa Aesar, 0.01 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min' (2,000 rotations/minute) for two minutes using the rotation and revolution-type stirring device (Planetary Vacuum Mixer ARV-310, manufactured by Thinky Corporation).

This liquid mixture was used as a copper paste for joining 7.

Preparation Example 8

α-Terpineol (manufactured by Wako Pure Chemical Corporation, 0.46 g) and isobornyl cyclohexanol (MTPH, manufactured by Nippon Terpene Chemicals, Inc., 0.20 g) as dispersants, CH-0200 (flake shape, manufactured by Mitsui Mining & Smelting Co., Ltd., 3.39 g) as submicro copper particles, MA-C025 (flake shape, manufactured by Mitsui Mining & Smelting Co., Ltd., 1.45 g) as micro copper particles, and lauric acid (manufactured by Wako Pure Chemical Corporation, 0.11 g) were kneaded using an agate mortar until no dried powder remained, and a liquid mixture was moved to a poly bottle. The air-tightened poly bottle was stirred at 2,000 min' (2,000 rotations/minute) for two minutes using a rotation and revolution-type stirring device (Planetary Vacuum Mixer ARV-310, manufactured by Thinky Corporation). After that, antimony (manufactured by Wako Pure Chemical Corporation, 0.01 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min' (2,000 rotations/minute) for two minutes using the rotation and revolution-type stirring device (Planetary Vacuum Mixer ARV-310, manufactured by Thinky Corporation).

This liquid mixture was used as a copper paste for joining 8.

Preparation Example 9

α-Terpineol (manufactured by Wako Pure Chemical Corporation, 0.46 g) and isobornyl cyclohexanol (MTPH, manufactured by Nippon Terpene Chemicals, Inc., 0.20 g) as dispersants, CH-0200 (flake shape, manufactured by Mitsui Mining & Smelting Co., Ltd., 3.39 g) as submicro copper particles, MA-C025 (flake shape, manufactured by Mitsui Mining & Smelting Co., Ltd., 1.45 g) as micro copper particles, and lauric acid (manufactured by Wako Pure Chemical Corporation, 0.11 g) were kneaded using an agate mortar until no dried powder remained, and a liquid mixture was moved to a poly bottle. The air-tightened poly bottle was stirred at 2,000 min' (2,000 rotations/minute) for two minutes using a rotation and revolution-type stirring device (Planetary Vacuum Mixer ARV-310, manufactured by Thinky Corporation). After that, nickel (manufactured by Fukuda Metal Foil & Powder Co., Ltd., 0.01 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min$^{-1}$ (2,000 rotations/minute) for two minutes using the rotation and revolution-type stirring device (Planetary Vacuum Mixer ARV-310, manufactured by Thinky Corporation).

This liquid mixture was used as a copper paste for joining 9.

Preparation Example 10

α-Terpineol (manufactured by Wako Pure Chemical Corporation, 0.46 g) and isobornyl cyclohexanol (MTPH, manufactured by Nippon Terpene Chemicals, Inc., 0.20 g) as dispersants, CH-0200 (flake shape, manufactured by Mitsui Mining & Smelting Co., Ltd., 3.39 g) as submicro copper particles, MA-C025 (flake shape, manufactured by Mitsui Mining & Smelting Co., Ltd., 1.45 g) as micro copper particles, and lauric acid (manufactured by Wako Pure Chemical Corporation, 0.11 g) were kneaded using an agate mortar until no dried powder remained, and a liquid mixture was moved to a poly bottle. The air-tightened poly bottle was stirred at 2,000 min$^{-1}$ (2,000 rotations/minute) for two minutes using a rotation and revolution-type stirring device (Planetary Vacuum Mixer ARV-310, manufactured by Thinky Corporation). After that, nickel (manufactured by Fukuda Metal Foil & Powder Co., Ltd., 0.005 g), zinc (product No.: 13789, manufactured by Alfa Aesar, 0.005 g), and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min$^{-1}$ (2,000 rotations/minute) for two minutes using the rotation and revolution-type stirring device (Planetary Vacuum Mixer ARV-310, manufactured by Thinky Corporation).

This liquid mixture was used as a copper paste for joining 10.

Preparation Example 11

α-Terpineol (manufactured by Wako Pure Chemical Corporation, 0.25 g) and isobornyl cyclohexanol (MTPH, manufactured by Nippon Terpene Chemicals, Inc., 0.11 g) as dispersants, CH-0200 (flake shape, manufactured by Mitsui Mining & Smelting Co., Ltd., 1.83 g) as submicro copper particles, MA-C025 (flake shape, manufactured by Mitsui Mining & Smelting Co., Ltd., 0.75 g) as micro copper particles, and lauric acid (manufactured by Wako Pure Chemical Corporation, 0.06 g) were kneaded using an agate mortar until no dried powder remained, and a liquid mixture was moved to a poly bottle. The air-tightened poly bottle was stirred at 2,000 min$^{-1}$ (2,000 rotations/minute) for two minutes using a rotation and revolution-type stirring device (Planetary Vacuum Mixer ARV-310, manufactured by Thinky Corporation). After that, zinc (product No.: 13789, manufactured by Alfa Aesar, 0.003 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min$^{-1}$ (2,000 rotations/minute) for two minutes using the rotation and revolution-type stirring device (Planetary Vacuum Mixer ARV-310, manufactured by Thinky Corporation).

This liquid mixture was used as a copper paste for joining 11.

Preparation Example 12

α-Terpineol (manufactured by Wako Pure Chemical Corporation, 0.25 g) and isobornyl cyclohexanol (MTPH, manufactured by Nippon Terpene Chemicals, Inc., 0.11 g) as dispersants, CH-0200 (flake shape, manufactured by Mitsui Mining & Smelting Co., Ltd., 1.83 g) as submicro copper particles, MA-C025 (flake shape, manufactured by Mitsui Mining & Smelting Co., Ltd., 0.75 g) as micro copper particles, and lauric acid (manufactured by Wako Pure Chemical Corporation, 0.06 g) were kneaded using an agate mortar until no dried powder remained, and a liquid mixture was moved to a poly bottle. The air-tightened poly bottle was stirred at 2,000 min$^{-1}$ (2,000 rotations/minute) for two minutes using a rotation and revolution-type stirring device (Planetary Vacuum Mixer ARV-310, manufactured by Thinky Corporation). After that, zinc (product No.: 13789, manufactured by Alfa Aesar, 0.005 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min$^{-1}$ (2,000 rotations/minute) for two minutes using the rotation and revolution-type stirring device (Planetary Vacuum Mixer ARV-310, manufactured by Thinky Corporation).

This liquid mixture was used as a copper paste for joining 12.

Preparation Example 13

α-Terpineol (manufactured by Wako Pure Chemical Corporation, 0.25 g) and isobornyl cyclohexanol (MTPH, manufactured by Nippon Terpene Chemicals, Inc., 0.11 g) as dispersants, CH-0200 (flake shape, manufactured by Mitsui Mining & Smelting Co., Ltd., 1.84 g) as submicro copper particles, MA-C025 (flake shape, manufactured by Mitsui Mining & Smelting Co., Ltd., 0.75 g) as micro copper particles, and lauric acid (manufactured by Wako Pure Chemical Corporation, 0.06 g) were kneaded using an agate mortar until no dried powder remained, and a liquid mixture was moved to a poly bottle. The air-tightened poly bottle was stirred at 2,000 min$^{-1}$ (2,000 rotations/minute) for two minutes using a rotation and revolution-type stirring device (Planetary Vacuum Mixer ARV-310, manufactured by Thinky Corporation). After that, zinc (product No.: 13789, manufactured by Alfa Aesar, 0.013 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min$^{-1}$ (2,000 rotations/minute) for two minutes using the rotation and revolution-type stirring device (Planetary Vacuum Mixer ARV-310, manufactured by Thinky Corporation).

This liquid mixture was used as a copper paste for joining 13.

Preparation Example 14

α-Terpineol (manufactured by Wako Pure Chemical Corporation, 0.25 g) and isobornyl cyclohexanol (MTPH, manufactured by Nippon Terpene Chemicals, Inc., 0.11 g) as dispersants, CH-0200 (flake shape, manufactured by Mitsui Mining & Smelting Co., Ltd., 1.83 g) as submicro copper particles, MA-C025 (flake shape, manufactured by Mitsui Mining & Smelting Co., Ltd., 0.75 g) as micro copper particles, and lauric acid (manufactured by Wako Pure Chemical Corporation, 0.06 g) were kneaded using an agate mortar until no dried powder remained, and a liquid mixture was moved to a poly bottle. The air-tightened poly bottle was stirred at 2,000 min$^{-1}$ (2,000 rotations/minute) for two minutes using a rotation and revolution-type stirring device (Planetary Vacuum Mixer ARV-310, manufactured by Thinky Corporation). After that, zinc (product No.: 13789, manufactured by Alfa Aesar, 0.027 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min$^{-1}$ (2,000 rotations/minute) for two minutes using the rotation and revolution-type stirring device (Planetary Vacuum Mixer ARV-310, manufactured by Thinky Corporation).

This liquid mixture was used as a copper paste for joining 14.

Preparation Example 15

α-Terpineol (manufactured by Wako Pure Chemical Corporation, 0.25 g) and isobornyl cyclohexanol (MTPH, manufactured by Nippon Terpene Chemicals, Inc., 0.11 g) as dispersants, CH-0200 (flake shape, manufactured by Mitsui Mining & Smelting Co., Ltd., 1.84 g) as submicro copper particles, MA-C025 (flake shape, manufactured by Mitsui Mining & Smelting Co., Ltd., 0.75 g) as micro copper particles, and lauric acid (manufactured by Wako Pure Chemical Corporation, 0.06 g) were kneaded using an agate mortar until no dried powder remained, and a liquid mixture was moved to a poly bottle. The air-tightened poly bottle was stirred at 2,000 min$^{-1}$ (2,000 rotations/minute) for two minutes using a rotation and revolution-type stirring device (Planetary Vacuum Mixer ARV-310, manufactured by Thinky Corporation). After that, zinc (product No.: 13789, manufactured by Alfa Aesar, 0.054 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min$^{-1}$ (2,000 rotations/minute) for two minutes using the rotation and revolution-type stirring device (Planetary Vacuum Mixer ARV-310, manufactured by Thinky Corporation).

This liquid mixture was used as a copper paste for joining 15.

Preparation Example 16

α-Terpineol (manufactured by Wako Pure Chemical Corporation, 0.25 g) and isobornyl cyclohexanol (MTPH, manufactured by Nippon Terpene Chemicals, Inc., 0.11 g) as dispersants, CH-0200 (flake shape, manufactured by Mitsui Mining & Smelting Co., Ltd., 1.83 g) as submicro copper particles, MA-C025 (flake shape, manufactured by Mitsui Mining & Smelting Co., Ltd., 0.75 g) as micro copper particles, and lauric acid (manufactured by Wako Pure Chemical Corporation, 0.06 g) were kneaded using an agate mortar until no dried powder remained, and a liquid mixture was moved to a poly bottle. The air-tightened poly bottle was stirred at 2,000 min$^{-1}$ (2,000 rotations/minute) for two minutes using a rotation and revolution-type stirring device (Planetary Vacuum Mixer ARV-310, manufactured by Thinky Corporation). After that, zinc (product No.: 13789, manufactured by Alfa Aesar, 0.14 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min$^{-1}$ (2,000 rotations/minute) for two minutes using the rotation and revolution-type stirring device (Planetary Vacuum Mixer ARV-310, manufactured by Thinky Corporation).

This liquid mixture was used as a copper paste for joining 16.

Preparation Example 17

α-Terpineol (manufactured by Wako Pure Chemical Corporation, 0.06 g) and isobornyl cyclohexanol (MTPH, manufactured by Nippon Terpene Chemicals, Inc., 0.06 g) as dispersants, HT-14 (manufactured by Mitsui Mining & Smelting Co., Ltd., 0.60 g) as submicro copper particles, MA-C025 (flake shape, manufactured by Mitsui Mining & Smelting Co., Ltd., 0.26 g) as micro copper particles, and lauric acid (manufactured by Wako Pure Chemical Corporation, 0.02 g) were kneaded using an agate mortar until no dried powder remained, and a liquid mixture was moved to a poly bottle. The air-tightened poly bottle was stirred at 2,000 $min^{-1}$ (2,000 rotations/minute) for two minutes using a rotation and revolution-type stirring device (Planetary Vacuum Mixer ARV-310, manufactured by Thinky Corporation). After that, silver powder (AgC-239, manufactured by Fukuda Metal Foil & Powder Co., Ltd., 0.0012 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 $min^{-1}$ (2,000 rotations/minute) for two minutes using the rotation and revolution-type stirring device (Planetary Vacuum Mixer ARV-310, manufactured by Thinky Corporation).

This liquid mixture was used as a copper paste for joining 17.

Preparation Example 18

α-Terpineol (manufactured by Wako Pure Chemical Corporation, 0.06 g) and isobornyl cyclohexanol (MTPH, manufactured by Nippon Terpene Chemicals, Inc., 0.06 g) as dispersants, HT-14 (manufactured by Mitsui Mining & Smelting Co., Ltd., 0.62 g) as submicro copper particles, MA-C025 (flake shape, manufactured by Mitsui Mining & Smelting Co., Ltd., 0.27 g) as micro copper particles, and lauric acid (manufactured by Wako Pure Chemical Corporation, 0.02 g) were kneaded using an agate mortar until no dried powder remained, and a liquid mixture was moved to a poly bottle. The air-tightened poly bottle was stirred at 2,000 $min^{-1}$ (2,000 rotations/minute) for two minutes using a rotation and revolution-type stirring device (Planetary Vacuum Mixer ARV-310, manufactured by Thinky Corporation). After that, silver powder (AgC-239, product manufactured by Fukuda Metal Foil & Powder Co., Ltd., 0.0027 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 $min^{-1}$ (2,000 rotations/minute) for two minutes using the rotation and revolution-type stirring device (Planetary Vacuum Mixer ARV-310, manufactured by Thinky Corporation).

This liquid mixture was used as a copper paste for joining 18.

Preparation Example 19

α-Terpineol (manufactured by Wako Pure Chemical Corporation, 0.06 g) and isobornyl cyclohexanol (MTPH, manufactured by Nippon Terpene Chemicals, Inc., 0.06 g) as dispersants, HT-14 (manufactured by Mitsui Mining & Smelting Co., Ltd., 0.60 g) as submicro copper particles, MA-C025 (flake shape, manufactured by Mitsui Mining & Smelting Co., Ltd., 0.26 g) as micro copper particles, and lauric acid (manufactured by Wako Pure Chemical Corporation, 0.02 g) were kneaded using an agate mortar until no dried powder remained, and a liquid mixture was moved to a poly bottle. The air-tightened poly bottle was stirred at 2,000 $min^{-1}$ (2,000 rotations/minute) for two minutes using a rotation and revolution-type stirring device (Planetary Vacuum Mixer ARV-310, manufactured by Thinky Corporation). After that, silver powder (AgC-239, manufactured by Fukuda Metal Foil & Powder Co., Ltd., 0.0050 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 $min^{-1}$ (2,000 rotations/minute) for two minutes using the rotation and revolution-type stirring device (Planetary Vacuum Mixer ARV-310, manufactured by Thinky Corporation).

This liquid mixture was used as a copper paste for joining 19.

Preparation Example 20

α-Terpineol (manufactured by Wako Pure Chemical Corporation, 0.06 g) and isobornyl cyclohexanol (MTPH, manufactured by Nippon Terpene Chemicals, Inc., 0.06 g) as dispersants, HT-14 (manufactured by Mitsui Mining & Smelting Co., Ltd., 0.62 g) as submicro copper particles, MA-C025 (flake shape, manufactured by Mitsui Mining & Smelting Co., Ltd., 0.27 g) as micro copper particles, and lauric acid (manufactured by Wako Pure Chemical Corporation, 0.02 g) were kneaded using an agate mortar until no dried powder remained, and a liquid mixture was moved to a poly bottle. The air-tightened poly bottle was stirred at 2,000 $min^{-1}$ (2,000 rotations/minute) for two minutes using a rotation and revolution-type stirring device (Planetary Vacuum Mixer ARV-310, manufactured by Thinky Corporation). After that, silver powder (AgC-239, manufactured by Fukuda Metal Foil & Powder Co., Ltd., 0.010 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 $min^{-1}$ (2,000 rotations/minute) for two minutes using the rotation and revolution-type stirring device (Planetary Vacuum Mixer ARV-310, manufactured by Thinky Corporation).

This liquid mixture was used as a copper paste for joining 20.

Preparation Example 21

α-Terpineol (manufactured by Wako Pure Chemical Corporation, 0.06 g) and isobornyl cyclohexanol (MTPH, manufactured by Nippon Terpene Chemicals, Inc., 0.06 g) as dispersants, HT-14 (manufactured by Mitsui Mining & Smelting Co., Ltd., 0.61 g) as submicro copper particles, MA-C025 (flake shape, manufactured by Mitsui Mining & Smelting Co., Ltd., 0.26 g) as micro copper particles, and lauric acid (manufactured by Wako Pure Chemical Corporation, 0.02 g) were kneaded using an agate mortar until no dried powder remained, and a liquid mixture was moved to a poly bottle. The air-tightened poly bottle was stirred at 2,000 min$^{-1}$ (2,000 rotations/minute) for two minutes using a rotation and revolution-type stirring device (Planetary Vacuum Mixer ARV-310, manufactured by Thinky Corporation). After that, silver powder (AgC-239, manufactured by Fukuda Metal Foil & Powder Co., Ltd., 0.050 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min$^{-1}$ (2,000 rotations/minute) for two minutes using the rotation and revolution-type stirring device (Planetary Vacuum Mixer ARV-310, manufactured by Thinky Corporation).

This liquid mixture was used as a copper paste for joining 21.

Preparation Example 22

α-Terpineol (manufactured by Wako Pure Chemical Corporation, 0.25 g) and isobornyl cyclohexanol (MTPH, manufactured by Nippon Terpene Chemicals, Inc., 0.11 g) as dispersants, CH-0200 (flake shape, manufactured by Mitsui Mining & Smelting Co., Ltd., 1.84 g) as submicro copper particles, MA-C025 (flake shape, manufactured by Mitsui Mining & Smelting Co., Ltd., 0.75 g) as micro copper particles, and lauric acid (manufactured by Wako Pure Chemical Corporation, 0.06 g) were kneaded using an agate mortar until no dried powder remained, and a liquid mixture was moved to a poly bottle. The air-tightened poly bottle was stirred at 2,000 min$^{-1}$ (2,000 rotations/minute) for two minutes using a rotation and revolution-type stirring device (Planetary Vacuum Mixer ARV-310, manufactured by Thinky Corporation). After that, zinc (product No.: 13789, manufactured by Alfa Aesar, 0.35 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min$^{-1}$ (2,000 rotations/minute) for two minutes using the rotation and revolution-type stirring device (Planetary Vacuum Mixer ARV-310, manufactured by Thinky Corporation).

This liquid mixture was used as a copper paste for joining 22.

Preparation Example 23

α-Terpineol (manufactured by Wako Pure Chemical Corporation, 0.25 g), isobornyl cyclohexanol (MTPH, manufactured by Nippon Terpene Chemicals, Inc., 0.11 g), CH-0200 (flake shape, manufactured by Mitsui Mining & Smelting Co., Ltd., 1.84 g) as submicro copper particles, MA-C025 (flake shape, manufactured by Mitsui Mining & Smelting Co., Ltd., 0.75 g) as micro copper particles, and lauric acid (manufactured by Wako Pure Chemical Corporation, 0.06 g) were kneaded using an agate mortar until no dried powder remained, and a liquid mixture was moved to a poly bottle. The air-tightened poly bottle was stirred at 2,000 min$^{-1}$ (2,000 rotations/minute) for two minutes using a rotation and revolution-type stirring device (Planetary Vacuum Mixer ARV-310, manufactured by Thinky Corporation). After that, zinc (product No.: 13789, manufactured by Alfa Aesar, 0.50 g) and the liquid mixture were kneaded using the agate mortar until no dried powder remained, and a liquid mixture was moved to a poly bottle. This liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min$^{-1}$ (2,000 rotations/minute) for two minutes using the rotation and revolution-type stirring device (Planetary Vacuum Mixer ARV-310, manufactured by Thinky Corporation).

This liquid mixture was used as a copper paste for joining 23.

Preparation Example 24

α-Terpineol (manufactured by Wako Pure Chemical Corporation, 0.25 g), isobornyl cyclohexanol (MTPH, manufactured by Nippon Terpene Chemicals, Inc., 0.11 g), CH-0200 (flake shape, manufactured by Mitsui Mining & Smelting Co., Ltd., 1.84 g) as submicro copper particles, MA-C025 (flake shape, manufactured by Mitsui Mining & Smelting Co., Ltd., 0.75 g) as micro copper particles, and lauric acid (manufactured by Wako Pure Chemical Corporation, 0.06 g) were kneaded using an agate mortar until no dried powder remained, and a liquid mixture was moved to a poly bottle. The air-tightened poly bottle was stirred at 2,000 min$^{-1}$ (2,000 rotations/minute) for two minutes using a rotation and revolution-type stirring device (Planetary Vacuum Mixer ARV-310, manufactured by Thinky Corporation). Next, the liquid mixture was treated at 19.6 kHz and 600 W for one minute using an ultrasonic homogenizer (US-600, manufactured by Nippon Seiki Co., Ltd.). Next, the air-tightened poly bottle was stirred at 2,000 min$^{-1}$ (2,000 rotations/minute) for two minutes using the rotation and revolution-type stirring device (Planetary Vacuum Mixer ARV-310, manufactured by Thinky Corporation).

This liquid mixture was used as a copper paste for joining 24.

Manufacturing of Joined Body

Examples 1 to 21

Joined bodies were manufactured using the copper pastes for joining 1 to 21 according to the following method. The die shear strengths of the joined bodies were measured using a method described below.

A stainless-steel metal mask (thickness: 100 μm) having nine (3×3) 3 mm×3 mm square openings was placed on a 19 mm×25 mm nickel-plated copper sheet (thickness: 3 mm), and the copper paste for joining was applied thereto by stencil printing in which a metal squeegee was used. A silicon chip (thickness: 400 μm) having a gold-plated 3 mm×3 mm surface to be attached was placed on the applied copper paste for joining and slightly pressed using a tweezer. The silicon chip on the copper paste for joining was set in a tube furnace (manufactured by AVC Co., Ltd.), and argon gas was caused to flow thereinto at 3 L/min, thereby substituting the air into the argon gas. After that, the temperature was increased for 30 minutes under the flow of hydrogen gas at 300 ml/min After the increase of the temperature, a sintering treatment was carried out under conditions of a peak temperature of 250° C. and a peak temperature-holding time of 60 minutes, thereby obtaining a joined body in which the nickel-plated copper sheet and the gold-plated silicon chip were joined together. After the sintering, the joined body was cooled to 200° C. for 30 minutes and then cooled with the argon gas at a changed flow rate of 0.3 L/min, and the joined body was removed into the air at 50° C. or lower.

Example 22

A joined body was manufactured using the copper paste for joining 12 according to the following method. The die shear strength of the joined body was measured using a method described below.

A stainless-steel metal mask (thickness: 100 µm) having nine (3×3) 3 mm×3 mm square openings was placed on a 19 mm×25 mm nickel-plated copper sheet (thickness: 3 mm), and the copper paste for joining was applied thereto by stencil printing in which a metal squeegee was used. A silicon chip (thickness: 400 µm) having a nickel-plated 3 mm×3 mm surface to be attached was placed on the applied copper paste for joining and slightly pressed using a tweezer. The silicon chip on the copper paste for joining was set in a tube furnace (manufactured by AVC Co., Ltd.), and argon gas was caused to flow thereinto at 3 L/min, thereby substituting the air into the argon gas. After that, the temperature was increased for 30 minutes under the flow of hydrogen gas at 300 ml/min After the increase of the temperature, a sintering treatment was carried out under conditions of a peak temperature of 250° C. and a peak temperature-holding time of 60 minutes, thereby obtaining a joined body in which the nickel-plated copper sheet and the nickel-plated silicon chip were joined together. After the sintering, the joined body was cooled to 200° C. for 30 minutes and then cooled with the argon gas at a changed flow rate of 0.3 L/min, and the joined body was removed into the air at 50° C. or lower.

Example 23

A joined body was manufactured using the copper paste for joining 12 according to the following method. The die shear strength of the joined body was measured using a method described below.

A stainless-steel metal mask (thickness: 100 µm) having nine (3×3) 3 mm×3 mm square openings was placed on a 19 mm×25 mm nickel-plated copper sheet (thickness: 3 mm), and the copper paste for joining was applied thereto by stencil printing in which a metal squeegee was used. A silicon chip (thickness: 400 µm) having a nickel-plated 3 mm×3 mm surface to be attached was placed on the applied copper paste for joining and slightly pressed using a tweezer. The silicon chip on the copper paste for joining was set in a tube furnace (manufactured by AVC Co., Ltd.), and argon gas was caused to flow thereinto at 3 L/min, thereby substituting the air into the argon gas. After that, the temperature was increased for 30 minutes under the flow of hydrogen gas at 300 ml/min After the increase of the temperature, a sintering treatment was carried out under conditions of a peak temperature of 300° C. and a peak temperature-holding time of 60 minutes, thereby obtaining a joined body in which the nickel-plated copper sheet and the nickel-plated silicon chip were joined together. After the sintering, the joined body was cooled to 200° C. for 30 minutes and then cooled with the argon gas at a changed flow rate of 0.3 L/min, and the joined body was removed into the air at 50° C. or lower.

Example 24

A joined body was manufactured using the copper paste for joining 12 according to the following method. The die shear strength of the joined body was measured using a method described below.

A stainless-steel metal mask (thickness: 100 µm) having nine (3×3) 3 mm×3 mm square openings was placed on a 19 mm×25 mm nickel-plated copper sheet (thickness: 3 mm), and the copper paste for joining was applied thereto by stencil printing in which a metal squeegee was used. A silicon chip (thickness: 400 µm) having a gold-plated 3 mm×3 mm surface to be attached was placed on the applied copper paste for joining and slightly pressed using a tweezer. The silicon chip on the copper paste for joining was set in a tube furnace (manufactured by AVC Co., Ltd.), and argon gas was caused to flow thereinto at 3 L/min, thereby substituting the air into the argon gas. After that, the temperature was increased for 30 minutes under the flow of hydrogen gas at 300 ml/min After the increase of the temperature, a sintering treatment was carried out under conditions of a peak temperature of 300° C. and a peak temperature-holding time of 60 minutes, thereby obtaining a joined body in which the nickel-plated copper sheet and the nickel-plated silicon chip were joined together. After the sintering, the joined body was cooled to 200° C. for 30 minutes and then cooled with the argon gas at a changed flow rate of 0.3 L/min, and the joined body was removed into the air at 50° C. or lower.

Example 25

A joined body was manufactured using the copper paste for joining 12 according to the following method. The die shear strength of the joined body was measured using a method described below.

A stainless-steel metal mask (thickness: 100 µm) having nine (3×3) 3 mm×3 mm square openings was placed on a 19 mm×25 mm nickel-plated copper sheet (thickness: 3 mm), and the copper paste for joining was applied thereto by stencil printing in which a metal squeegee was used. A silicon chip (thickness: 400 µm) having a gold-plated 3 mm×3 mm surface to be attached was placed on the applied copper paste for joining and slightly pressed using a tweezer. The silicon chip on the copper paste for joining was set in a tube furnace (manufactured by AVC Co., Ltd.), and argon gas was caused to flow thereinto at 3 L/min, thereby substituting the air into the argon gas. After that, the temperature was increased for 30 minutes under the flow of hydrogen gas at 300 ml/min After the increase of the temperature, a sintering treatment was carried out under conditions of a peak temperature of 300° C. and a peak temperature-holding time of 60 minutes, thereby obtaining a joined body in which the nickel-plated copper sheet and the nickel-plated silicon chip were joined together. After the sintering, the joined body was cooled to 200° C. for 30 minutes and then cooled with the argon gas at a changed flow rate of 0.3 L/min, and the joined body was removed into the air at 50° C. or lower.

Example 26

A joined body was manufactured using the copper paste for joining 12 according to the following method. The die shear strength of the joined body was measured using a method described below.

A stainless-steel metal mask (thickness: 100 µm) having nine (3×3) 3 mm×3 mm square openings was placed on a 19 mm×25 mm nickel-plated copper sheet (thickness: 3 mm), and the copper paste for joining was applied thereto by stencil printing in which a metal squeegee was used. A silicon chip (thickness: 400 µm) having a silver-plated 3 mm×3 mm surface to be attached was placed on the applied copper paste for joining and slightly pressed using a tweezer. The silicon chip on the copper paste for joining was set in a tube furnace (manufactured by AVC Co., Ltd.), and argon gas was caused to flow thereinto at 3 L/min, thereby substituting the air into the argon gas. After that, the temperature was increased for 30 minutes under the flow of hydrogen gas at 300 ml/min After the increase of the temperature, a sintering treatment was carried out under conditions of a peak temperature of 300° C. and a peak temperature-holding time of 60 minutes, thereby obtaining a joined body in which the nickel-plated copper sheet and the nickel-plated silicon chip were joined together. After the sintering, the joined body was cooled to 200° C. for 30 minutes and then cooled with the argon gas at a changed flow rate of 0.3 L/min, and the joined body was removed into the air at 50° C. or lower.

Comparative Examples 1 to 3

Joined bodies were manufactured using the same method as in Example 1 except for the fact that the copper pastes for joining 22 to 24 were used. The die shear strengths of the joined bodies were measured using a method described below.

Comparative Example 4

A joined body was manufactured using the same method as in Example 24 except for the fact that the copper paste for joining 24 was used. The die shear strengths of the joined bodies were measured using a method described below.

Comparative Example 5

A joined body was manufactured using the same method as in Example 23 except for the fact that the copper paste for joining 24 was used. The die shear strengths of the joined bodies were measured using a method described below.

Comparative Example 6

A joined body was manufactured using the same method as in Example 25 except for the fact that the copper paste for joining 24 was used. The die shear strengths of the joined bodies were measured using a method described below.

Comparative Example 7

A joined body was manufactured using the same method as in Example 26 except for the fact that the copper paste for joining 24 was used. The die shear strengths of the joined bodies were measured using a method described below.

<Measurement Methods>
(Die Shear Strength)

The joining strength of the joined body was evaluated using a die shear strength. The joined body was set in a universal bond tester (4000 series, manufactured by Nordson Dage) mounted with a DS-100 load cell, the silicon chip was pressed in the horizontal direction at a measurement speed of 5 mm/min and a measurement height of 50 μm, and the die shear strength of the joined body was measured. An average value of values obtained by measuring eight joined bodies was used as the die shear strength.

(50% Volume-Average Particle Diameter)

The 50% volume-average particle diameter was measured using a Shimadzu nanoparticle diameter analyser (SALD-7500nano, manufactured by Shimadzu Corporation) and the affiliated software (WingSALDII-7500- for Japanese V3., manufactured by Shimadzu Corporation) according to the following (1) to (5).

(1) WingSALDII-7500- for Japanese V3.1 was initiated using a personal computer affiliated to the measurement device, a manual was pressed, and the device was initialized. After the end of the initialization, a storage file name was designated, "Next" was clicked, the measurement conditions and the particle dimeter distribution calculation conditions were set as descried below, and "Next" was clicked.

(Measurement Conditions)
Detection of Diffracted/Scattered Light
Average number of times (number of times of measurement: 1):128, number of times of measurement: 1, measurement interval (seconds): 2
Measurement Light Absorption Range Maximum value: 0.2, minimum value: 0
Blank Region/Measurement Region
Blank measurement permissible variation maximum value: 150, measurement optimal range (MAX): 45,000, measurement optical range (MIN): 15,000
(Particle Dimeter Distribution Calculation Conditions)
Selection of refractive index: reference specimen/pure metal/semiconductor or the like (solid value)
Sample material: 4 Copper
Selection of refractive index: 1.18 to 2.21, "Evaluate the side/rear sensor" was checked.

(2) Blank Measurement

A batch cell for a Shimadzu nanoparticle diameter analyser (SALD-BC75, manufactured by Shimadzu Corporation) was attached to SALD-7500nano, and measurement was carried out. α-Terpineol (manufactured by Wako Pure Chemical Corporation) was added dropwise using a dropper into a load-attached batch cell affiliated to SALD-BC75 (component No. S347-61030-41, manufactured by Shimadzu Corporation, hereinafter referred to as "the batch cell") so as to be confined between two gauge lines of the batch cell.

"Diagnosis" and "adjustment" were selected on the screen of WingSALDII-7500- for Japanese V3., and the positioning sensor output being in the measurement permissible range was confirmed.

"Cancel" was clicked to return to the original image, the blank measurement was selected, and measurement was carried out.

(3) Preparation of Measurement Solution

A copper paste for joining (2 mg) which needed to be measured was placed on a stirring lever of a batch cell holder (component No. S347-62301, manufactured by Shimadzu Corporation) affiliated to SALD-BC75 and set to the load-attached batch cell. Next, "Stirrer" was selected on the screen of WingSALDII-7500- for Japanese V3., and stirring was carried out for 15 minutes.

(4) Measurement

After the stirring, "measurement" was selected on the screen of WingSALDII-7500- for Japanese V3., and measurement was carried out. The operations (1) to (4) were repeated four times, thereby carrying out the measurement four times.

(5) Statistics

WingSALDII-7500- for Japanese V3. was initiated, "open" was clicked, and the measured film was selected, thereby displaying measurement data on the screen of WingSALDII-7500- for Japanese V3. "Overlapping drawing" was clicked, the 50.000% diameter was displayed in the bottom end of the screen, and the average value of four measurement values was used as the 50% volume-average particle diameter.

The measurement results of the examples and the comparative examples are shown in Tables 1 to 6.

TABLE 1

|  |  | Example 1 | Example 2 | Example 3 | Example 4 | Example 5 |
|---|---|---|---|---|---|---|
| Copper paste for joining |  | 1 | 2 | 3 | 4 | 5 |
| Micro copper particles | BET specific surface area ($\times 10^6$ m$^2$/m$^3$) | 8.42 | 8.42 | 8.42 | 8.42 | 8.42 |
|  | Aspect ratio | 6.60 | 6.60 | 6.60 | 6.60 | 6.60 |
|  | 50% volume-average particle diameter (μm) | 7.5 | 7.5 | 7.5 | 7.5 | 7.5 |
|  | Mass proportion of micro copper particles with respect to total mass of copper particles (% by mass) | 30 | 30 | 30 | 30 | 30 |
|  | Amount added (g) | 1.45 | 1.45 | 1.45 | 1.45 | 1.45 |
| Submicro copper particles | 50% volume-average particle diameter (μm) | 0.36 | 0.36 | 0.36 | 0.36 | 0.36 |
|  | Mass proportion of submicro copper particles with respect to total mass of copper particles (% by mass) | 70 | 70 | 70 | 70 | 70 |
|  | Amount added (g) | 3.39 | 3.38 | 3.38 | 3.39 | 3.38 |
| Dispersant | α-Terpineol (g) | 0.46 | 0.46 | 0.46 | 0.46 | 0.46 |
|  | MTPH (g) | 0.20 | 0.20 | 0.20 | 0.20 | 0.20 |
| Additive | Amount of lauric acid added (g) | 0.11 | 0.11 | 0.11 | 0.11 | 0.11 |
| Second particles | Kind of metal | Zinc stearate | Tin | Indium | Gold | Palladium |
|  | Amount added (g) | 0.01 | 0.01 | 0.01 | 0.01 | 0.01 |
|  | Mass proportion with respect to sum of masses of copper particles and second particles (% by mass) | 0.20 | 0.20 | 0.20 | 0.20 | 0.20 |
| Body to be attached | Surface material of semiconductor member | Gold | Gold | Gold | Gold | Gold |
|  | Surface material of metal substrate | Nickel | Nickel | Nickel | Nickel | Nickel |
| Joining conditions | Peak temperature (° C.) | 0.20 | 250 | 250 | 250 | 250 |
|  | Peak temperature-holding time (minutes) | 60 | 60 | 60 | 60 | 60 |
|  | Pressurization force (MPa) | 0 | 0 | 0 | 0 | 0 |
| Characteristics | Die shear strength at 25° C. (MPa) | 19 | 25 | 23 | 28 | 15 |

TABLE 2

|  |  | Example 6 | Example 7 | Example 8 | Example 9 | Example 10 |
|---|---|---|---|---|---|---|
| Copper paste for joining |  | 6 | 7 | 8 | 9 | 10 |
| Micro copper particles | BET specific surface area ($\times 10^6$ m$^2$/m$^3$) | 8.42 | 8.42 | 8.42 | 8.42 | 8.42 |
|  | Aspect ratio | 6.6 | 6.6 | 6.60 | 6.60 | 6.60 |
|  | 50% volume-average particle diameter (μm) | 7.5 | 7.5 | 7.5 | 7.5 | 7.5 |
|  | Mass proportion of micro copper particles with respect to total mass of copper particles (% by mass) | 30 | 30 | 30 | 30 | 30 |
|  | Amount added (g) | 1.45 | 1.45 | 1.45 | 1.45 | 1.45 |
| Submicro copper particles | 50% volume-average particle diameter (μm) | 0.36 | 0.36 | 0.36 | 0.36 | 0.36 |
|  | Mass proportion of submicro copper particles with respect to total mass of copper particles (% by mass) | 70 | 70 | 70 | 70 | 70 |
|  | Amount added (g) | 3.39 | 3.38 | 3.39 | 3.39 | 3.39 |
| Dispersant | α-Terpineol (g) | 0.46 | 0.46 | 0.46 | 0.46 | 0.46 |
|  | MTPH (g) | 0.20 | 0.20 | 0.20 | 0.20 | 0.20 |
| Additive | Amount of lauric acid added (g) | 0.11 | 0.11 | 0.11 | 0.11 | 0.11 |
| Second particles | Kind of metal | Vanadium | Aluminum | Antimony | Nickel | Nickel/zinc |
|  | Amount added (g) | 0.01 | 0.01 | 0.01 | 0.01 | 0.005/0.005 |
|  | Mass proportion with respect to sum of masses of copper particles and second particles (% by mass) | 0.20 | 0.20 | 0.20 | 0.20 | 0.20 |
| Body to be attached | Surface material of semiconductor member | Gold | Gold | Gold | Gold | Gold |
|  | Surface material of metal substrate | Nickel | Nickel | Nickel | Nickel | Nickel |
| Joining conditions | Peak temperature (° C.) | 250 | 250 | 250 | 250 | 250 |
|  | Peak temperature-holding time (minutes) | 60 | 60 | 60 | 60 | 60 |
|  | Pressurization force (MPa) | 0 | 0 | 0 | 0 | 0 |
| Characteristics | Die shear strength at 25° C. (MPa) | 21 | 19 | 17 | 18 | 17 |

TABLE 3

|  |  | Example 11 | Example 12 | Example 13 | Example 14 | Example 15 | Example 16 |
|---|---|---|---|---|---|---|---|
| Copper paste for joining |  | 11 | 12 | 13 | 14 | 15 | 16 |
| Micro copper particles | BET specific surface area ($\times 10^6$ m$^2$/m$^3$) | 8.42 | 8.42 | 8.42 | 8.42 | 8.42 | 8.42 |
|  | Aspect ratio | 6.60 | 6.60 | 6.60 | 6.60 | 6.6 | 6.6 |
|  | 50% volume-average particle diameter (μm) | 7.5 | 7.5 | 7.5 | 7.5 | 7.5 | 7.5 |
|  | Mass proportion of micro copper particles with respect to total mass of copper particles (% by mass) | 30 | 30 | 30 | 30 | 30 | 30 |
|  | Amount added (g) | 0.75 | 0.75 | 0.75 | 0.75 | 0.75 | 0.75 |

TABLE 3-continued

| | | Example 11 | Example 12 | Example 13 | Example 14 | Example 15 | Example 16 |
|---|---|---|---|---|---|---|---|
| Submico copper particles | 50% volume-average particle diameter (μm) | 0.36 | 0.36 | 0.36 | 0.36 | 0.36 | 0.36 |
| | Mass proportion of submicro copper particles with respect to total mass of copper particles (% by mass) | 70 | 70 | 70 | 70 | 70 | 70 |
| | Amount added (g) | 1.83 | 1.83 | 1.84 | 1.83 | 1.84 | 1.83 |
| Dispersant | α-Terpineol (g) | 0.25 | 0.25 | 0.25 | 0.25 | 0.25 | 0.25 |
| | MTPH (g) | 0.11 | 0.11 | 0.11 | 0.11 | 0.11 | 0.11 |
| Additive | Amount of lauric acid added (g) | 0.06 | 0.06 | 0.06 | 0.06 | 0.06 | 0.06 |
| Second particles | Kind of metal | Zinc | Zinc | Zinc | Zinc | Zinc | Zinc |
| | Amount added (g) | 0.003 | 0.005 | 0.013 | 0.027 | 0.054 | 0.14 |
| | Mass proportion with respect to sum of masses of copper particles and second particles (% by mass) | 0.12 | 0.19 | 0.50 | 0.027 | 2.04 | 5.15 |
| Body to be attached | Surface material of semiconductor member | Gold | Gold | Gold | Gold | Gold | Gold |
| | Surface material of metal substrate | Nickel | Nickel | Nickel | Nickel | Nickel | Nickel |
| Joining conditions | Peak temperature (° C.) | 250 | 250 | 250 | 250 | 250 | 250 |
| | Peak temperature-holding time (minutes) | 60 | 60 | 60 | 60 | 60 | 60 |
| | Pressurization force (MPa) | 0 | 0 | 0 | 0 | 0 | 0 |
| Characteristics | Die shear strength at 25° C. (MPa) | 23 | 38 | 37 | 33 | 26 | 14 |

TABLE 4

| | | Example 17 | Example 18 | Example 19 | Example 20 | Example 20 |
|---|---|---|---|---|---|---|
| Copper paste for joining | | 17 | 18 | 19 | 20 | 21 |
| Micro copper particles | BET specific surface area (×10$^6$ m$^2$/m$^3$) | 8.42 | 8.42 | 8.42 | 8.42 | 8.42 |
| | Aspect ratio | 6.60 | 6.60 | 6.60 | 6.60 | 6.60 |
| | 50% volume-average particle diameter (μm) | 7.5 | 7.5 | 7.5 | 7.5 | 7.5 |
| | Mass proportion of micro copper particles with respect to total mass of copper particles (% by mass) | 30 | 30 | 30 | 30 | 30 |
| | Amount added (g) | 0.26 | 0.27 | 0.26 | 0.27 | 0.26 |
| Submicro copper particles | 50% volume-average particle diameter (μm) | 0.36 | 0.36 | 0.36 | 0.36 | 0.36 |
| | Mass proportion of submicro copper particles with respect to total mass of copper particles (% by mass) | 70 | 70 | 70 | 70 | 70 |
| | Amount added (g) | 0.60 | 0.62 | 0.60 | 0.62 | 0.61 |
| Dispersant | α-Terpineol (g) | 0.06 | 0.06 | 0.06 | 0.06 | 0.06 |
| | MTPH (g) | 0.06 | 0.06 | 0.06 | 0.06 | 0.06 |
| Additive | Amount of lauric acid added (g) | 0.02 | 0.02 | 0.02 | 0.02 | 0.02 |
| Second particles | Kind of metal | Silver | Silver | Silver | Silver | Silver |
| | Amount added (g) | 0.0012 | 0.0027 | 0.0050 | 0.010 | 0.050 |
| | Mass proportion with respect to sum of masses of copper particles and second particles (% by mass) | 0.14 | 0.30 | 0.58 | 1.11 | 5.43 |
| Body to be attached | Surface material of semiconductor member | Gold | Gold | Gold | Gold | Gold |
| | Surface material of metal substrate | Nickel | Nickel | Nickel | Nickel | Nickel |
| Joining conditions | Peak temperature (° C.) | 250 | 250 | 250 | 250 | 250 |
| | Peak temperature-holding time (minutes) | 60 | 60 | 60 | 60 | 60 |
| | Pressurization force (MPa) | 0 | 0 | 0 | 0 | 0 |
| Characteristics | Die shear strength at 25° C. (MPa) | 22 | 27 | 29 | 30 | 26 |

TABLE 5

| | | Example 22 | Example 23 | Example 24 | Example 25 | Example 26 |
|---|---|---|---|---|---|---|
| Copper paste for joining | | 12 | 12 | 12 | 12 | 12 |
| Micro copper particles | BET specific surface area (×10$^6$ m$^2$/m$^3$) | 8.42 | 8.42 | 8.42 | 8.42 | 8.42 |
| | Aspect ratio | 6.60 | 6.60 | 6.60 | 6.60 | 6.60 |
| | 50% volume-average particle diameter (μm) | 7.5 | 7.5 | 7.5 | 7.5 | 7.5 |
| | Mass proportion of micro copper particles with respect to total mass of copper particles (% by mass) | 30 | 30 | 30 | 30 | 30 |
| | Amount added (g) | 1.45 | 1.45 | 1.45 | 1.45 | 1.45 |
| Submicro copper particles | 50% volume-average particle diameter (μm) | 0.36 | 0.36 | 0.36 | 0.36 | 0.36 |
| | Mass proportion of submicro copper particles with respect to total mass of copper particles (% by mass) | 70 | 70 | 70 | 70 | 70 |
| | Amount added (g) | 3.38 | 3.38 | 3.38 | 3.38 | 3.38 |
| Dispersant | α-Terpineol (g) | 0.46 | 0.46 | 0.46 | 0.46 | 0.46 |
| | MTPH (g) | 0.20 | 0.20 | 0.20 | 0.20 | 0.20 |
| Additive | Amount of lauric acid added (g) | 0.11 | 0.11 | 0.11 | 0.11 | 0.11 |
| Second particles | Kind of metal | Zinc | Zinc | Zinc | Zinc | Zinc |

TABLE 5-continued

|  |  | Example 22 | Example 23 | Example 24 | Example 25 | Example 26 |
|---|---|---|---|---|---|---|
| particles | Amount added (g) | 0.01 | 0.01 | 0.01 | 0.01 | 0.01 |
|  | Mass proportion with respect to sum of masses of copper particles and second particles (% by mass) | 0.20 | 0.20 | 0.20 | 0.20 | 0.20 |
| Body to be attached | Surface material of semiconductor member | Nickel | Nickel | Gold | Gold | Gold |
|  | Surface material of metal substrate | Nickel | Nickel | Nickel | Copper | Nickel |
| Joining conditions | Peak temperature (° C.) | 250 | 300 | 300 | 300 | 300 |
|  | Peak temperature-holding time (minutes) | 60 | 60 | 60 | 60 | 60 |
|  | Pressurization force (MPa) | 0 | 0 | 0 | 0 | 0 |
| Characteristics | Die shear strength at 25° C. (MPa) | 35 | 38 | 31 | 36 | 38 |

TABLE 6

|  |  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|
| Copper paste for joining |  | 22 | 23 | 24 | 24 | 24 | 24 | 24 |
| Micro copper particles | BET specific surface area (×10$^6$ m$^2$/m$^3$) | 8.42 | 8.42 | 8.42 | 8.42 | 8.42 | 8.42 | 8.42 |
|  | Aspect ratio | 6.6 | 6.6 | 6.6 | 6.6 | 6.6 | 6.6 | 6.6 |
|  | 50% volume-average particle diameter (μm) | 7.5 | 7.5 | 7.5 | 7.5 | 7.5 | 7.5 | 7.5 |
|  | Mass proportion of micro copper particles with respect to total mass of copper particles (% by mass) | 30 | 30 | 30 | 30 | 30 | 30 | 30 |
|  | Amount added (g) | 0.75 | 0.75 | 0.75 | 0.75 | 0.75 | 0.75 | 0.75 |
| Submicro copper particles | 50% volume-average particle diameter (μm) | 0.36 | 0.36 | 0.36 | 0.36 | 0.36 | 0.36 | 0.36 |
|  | Mass proportion of submicro copper particles with respect to total mass of copper particles (% by mass) | 70 | 70 | 70 | 70 | 70 | 70 | 70 |
|  | Amount added (g) | 1.84 | 1.84 | 1.84 | 1.84 | 1.84 | 1.84 | 1.84 |
| Dispersant | α-Terpineol (g) | 0.25 | 0.25 | 0.25 | 0.25 | 0.25 | 0.25 | 0.25 |
|  | MTPH (g) | 0.11 | 0.11 | 0.11 | 0.11 | 0.11 | 0.11 | 0.11 |
| Additive | Amount of lauric acid added (g) | 0.06 | 0.06 | 0.06 | 0.06 | 0.06 | 0.06 | 0.06 |
| Second particles | Kind of metal | Zinc | Zinc | None | None | None | None | None |
|  | Amount added (g) | 0.35 | 0.50 | None | None | None | None | None |
|  | Mass proportion with respect to sum of masses of copper particles and second particles (% by mass) | 11.90 | 16.18 | 0 | 0 | 0 | 0 | 0 |
| Body to be attached | Surface material of semiconductor member | Gold | Gold | Gold | Gold | Nickel | Gold | Silver |
|  | Surface material of metal substrate | Nickel | Nickel | Nickel | Nickel | Nickel | Copper | Nickel |
| Joining conditions | Peak temperature (° C.) | 250 | 250 | 250 | 300 | 300 | 300 | 300 |
|  | Peak temperature-holding time (minutes) | 60 | 60 | 60 | 60 | 60 | 60 | 60 |
|  | Pressurization force (MPa) | 0 | 0 | 0 | 0 | 0 | 0 | 0 |
| Characteristics | Die shear strength at 25° C. (MPa) | 6 | 3 | 4 | 8 | 29 | 25 | 10 |

When the examples and the comparative examples are compared with each other, it is found that the content of the second particles has an influence on the die shear strength. According to the copper pastes for joining of the examples which included the second particles, it was possible to obtain joined bodies having an excellent die shear strength under a relatively low-temperature condition of 300° C. or lower without pressurization. Particularly, in the joined bodies including noble metal such as gold or silver in the surface to be attached, the above-described effect was significantly observed. This can be considered to be because the second particles including metal other than copper served as a sintering aid, and sintered bodies in which a plurality of kinds of metal formed a solid solution or was dispersed could be obtained, and thus the mechanical characteristics such as yield stress and fatigue strength of the sintered bodies were improved, and the die shear strength and the connection reliability also improved with respect to the surface to be attached including noble metal.

(Cross-Sectional Morphology Observation)

The joined body was fixed in a cup using a SAMPLKLIP (manufactured by Samplklip I, Buehler), an epoxy casting resin (EPOMOUNT, manufactured by Refine Tec Ltd.) was caused to flow to the periphery of the joined body until the entire sample was buried, the joined body was left to stand in a vacuum desiccator and defoamed by decreasing the pressure for one minute. After that, the joined body was left to stand at room temperature (25° C.) for 10 hours, thereby curing the epoxy casting resin. The cast joined body was cut using a refine saw Lo (RCA-005, manufactured by Refine Tec Ltd.) to which a diamond cutting foil (11-304, manufactured by Refine Tec Ltd.) was attached in the vicinity of a cross section that needed to be observed. The cross section was trimmed using a polishing device (Refine Polisher Hv, manufactured by Refine Tec Ltd.) to which water-proof polishing paper (CABO MAC PAPER, manufactured by Refine Tec Ltd.) was attached, a cross section in which the silicon chip did not have any cracks was cut out, and, furthermore, the excessive casting resin was trimmed so as to finish the cross section to a size in which the cross section could be set in a cross section polisher (CP) processing machine. Cross section polishing was carried out on the cut sample using a CP processing machine (IM4000, manufactured by Hitachi, Ltd.) under conditions of an accelerated voltage of 6 kV, an argon gas flow rate of 0.07 to 0.1 cm$^3$/min, and a treatment time of two hours, thereby processing the cross section. Platinum was sputtered to the cross section in a thickness of 10 nm using a sputtering device (ION SPUTTER, manufactured by Hitachi High-Technologies Corporation) so as to produce a sample for SEM observation, and the cross section of the joined body was observed at an applied voltage of 10 kV using the sample for SEM and a SEM device (ESEM XL30, manufactured by Koninklijke Philips N. V.).

Figure 3:
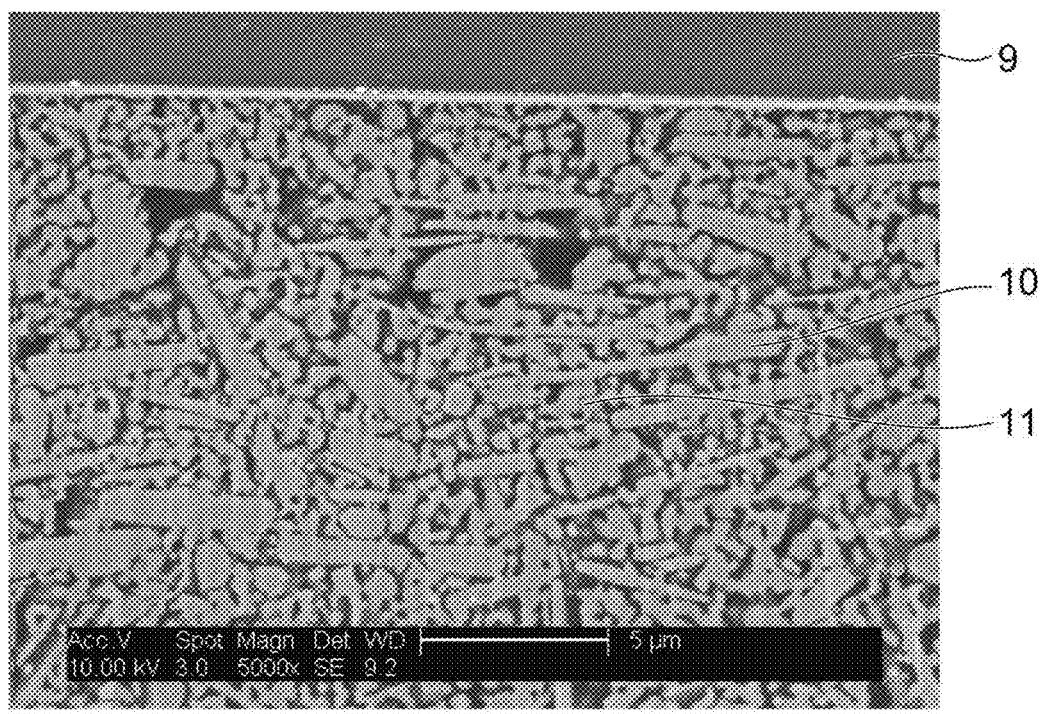
FIG. 3 is a SEM image of a cross section of a joined body of Example 12.
Figure 4:
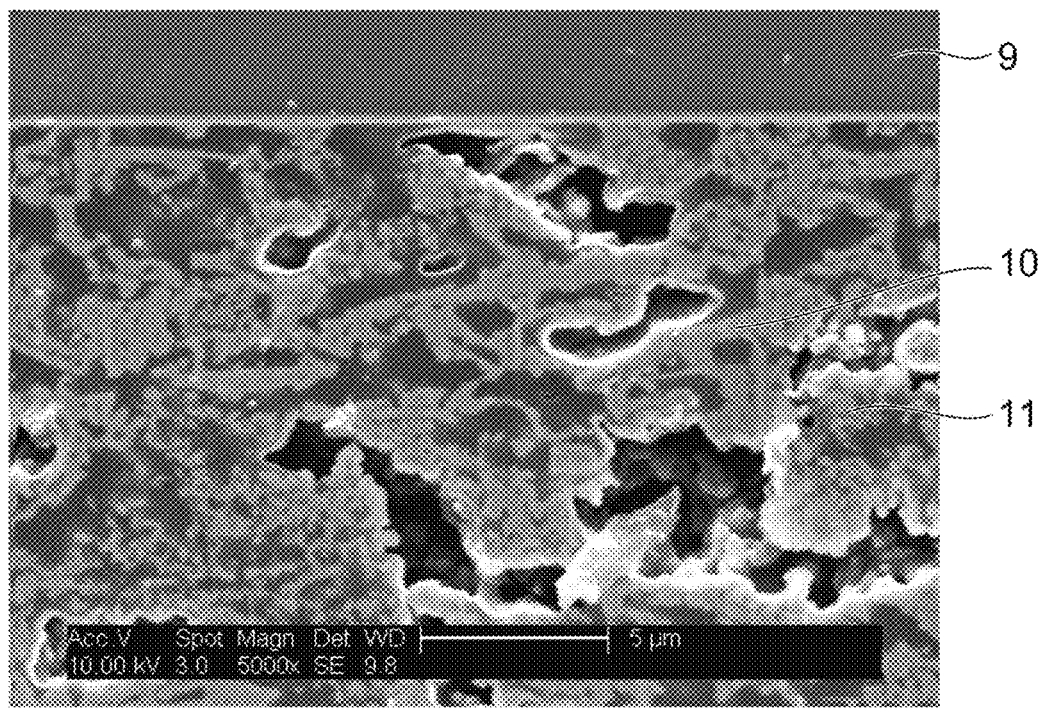
FIG. 4 is a SEM image of a cross section of a joined body of Comparative Example 1.

FIG. 3 illustrates a SEM image of the cross section of the joined body of Example 12. FIG. 4 illustrates a SEM image of the cross section of the joined body of Comparative Example 1. From FIG. 3, it is found that the sintered body of the copper paste for joining including an appropriate amount of the second particles was sintered in a state in which the micro copper particles 10 and the submicro copper particles 11 were appropriately oriented and joined with the gold-plated silicon chip 9. In addition, from FIG. 4, it can be considered that, in a case in which the amount of the second particles including metal other than copper is excessive, the sinterability of the micro copper particles 10 and the submicro copper particles 11 degrades, pores are generated in the sintered body, and a favorable die shear strength cannot be obtained.

INDUSTRIAL APPLICABILITY

The present invention is capable of providing a copper paste for joining capable of obtaining a sufficient joining strength even in a case in which a semiconductor element having a surface to be attached including noble metal is joined without pressurization. Furthermore, the present invention is capable of providing a method for manufacturing a joined body and a method for manufacturing a semiconductor device in which the copper paste for joining is used, a joined body, and a semiconductor device.

REFERENCE SIGNS LIST

1 . . . SINTERED BODY OF COPPER PASTE FOR JOINING 2 . . . FIRST MEMBER, 3 . . . SECOND MEMBER, 5a, 5b . . . LEAD FRAME, 6 . . . WIRE, 7 . . . MOLD RESIN, 8 . . . SEMICONDUCTOR ELEMENT, 9 . . . GOLD-PLATED SILICON CHIP, 10 . . . MICRO COPPER PARTICLE, 11 . . . SUBMICRO COPPER PARTICLE, 100 . . . JOINED BODY, 110 . . . SEMICONDUCTOR DEVICE.

The invention claimed is:

1. A copper paste for joining comprising:
copper particles;
second particles including a metal element other than copper; and
a dispersion medium,
wherein the copper particles include submicro copper particles having a volume-average particle diameter of 0.12 µm or more and 0.8 µm or less and micro copper particles having a volume-average particle diameter of 2 µm or more and 50 µm or less,
a sum of a content of the submicro copper particles and a content of the micro copper particles is 80% by mass or more of a sum of masses of the copper particles and the second particles,
the content of the submicro copper particles is 30% by mass or more and 90% by mass or less of a sum of a mass of the submicro copper particles and a mass of the micro copper particles, and
a content of the second particles is 0.01% by mass or more and 10% by mass or less of the sum of the masses of the copper particles and the second particles.

2. The copper paste for joining according to claim 1, wherein the second particles are metal particles.

3. The copper paste for joining according to claim 2, wherein the metal particles include at least one kind of metal selected from the group consisting of zinc, silver, gold, platinum, tin, indium, vanadium, aluminum, nickel, antimony, and palladium.

4. The copper paste for joining according to claim 2, wherein the metal particles include at least one kind of metal selected from the group consisting of zinc, silver, tin, indium, and vanadium.

5. The copper paste for joining according to claim 2, wherein the metal particles are zinc particles.

6. The copper paste for joining according to claim 5, wherein an aspect ratio of the zinc particle is 4 or more.

7. The copper paste for joining according to claim 2, comprising:
two or more kinds of the metal particles.

8. The copper paste for joining according to claim 1, wherein the second particles are fatty acid metal salt particles.

9. The copper paste for joining according to claim 8, wherein the fatty acid metal salt particles include a fatty acid metal salt of a fatty acid having 8 to 18 carbon atoms and silver, nickel, or zinc.

10. The copper paste for joining according to claim 8, wherein the fatty acid metal salt particles may include at least one kind of fatty acid metal salt selected from the group consisting of zinc stearate, silver stearate, zinc laurate, nickel laurate, and zinc octylate.

11. The copper paste for joining according to claim 1, wherein a volume-average particle diameter of the second particles is 150 µm or less.

12. The copper paste for joining according to claim 1, wherein the copper paste for joining is for non-pressurization joining.

13. A method for manufacturing a semiconductor device, comprising:
a step of preparing a laminate in which a first member, the copper paste for joining according to claim 1, and a second member are laminated in this order in a direction in which a weight of the first member applies and sintering the copper paste for joining in a state in which the copper paste for joining receives the weight of the first member or the weight of the first member and a pressure of 0.01 MPa or less,
wherein at least one of the first member and the second member is a semiconductor element.

14. The method for manufacturing a semiconductor device according to claim 13,
wherein a sintering temperature in the sintering step is 300° C. or lower.

15. A joined body comprising:
a first member;
a second member; and
a sintered body of the copper paste for joining according to claim 1 which joins the first member and the second member.

16. The joined body according to claim 15,
wherein at least one of the first member and the second member includes at least one kind of metal selected from the group consisting of silver, gold, platinum, and palladium on a surface in contact with the sintered body.

17. A semiconductor device comprising:
a first member;
a second member; and
a sintered body of the copper paste for joining according to claim 1 which joins the first member and the second member, wherein at least one of the first member and the second member is a semiconductor element.

* * * * *